United States Patent
Watanabe

(10) Patent No.: US 10,803,954 B2
(45) Date of Patent: Oct. 13, 2020

(54) MEMORY SYSTEM

(71) Applicant: TOSHIBA MEMORY CORPORATION, Tokyo (JP)

(72) Inventor: Kiwamu Watanabe, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 105 days.

(21) Appl. No.: 16/111,915

(22) Filed: Aug. 24, 2018

(65) Prior Publication Data

US 2019/0252024 A1 Aug. 15, 2019

(30) Foreign Application Priority Data

Feb. 9, 2018 (JP) .................................. 2018-021958

(51) Int. Cl.
| G11C 11/34 | (2006.01) |
| G11C 16/04 | (2006.01) |
| G11C 16/10 | (2006.01) |
| G11C 11/56 | (2006.01) |
| G11C 16/34 | (2006.01) |
| G11C 16/08 | (2006.01) |
| G11C 29/44 | (2006.01) |
| G11C 29/52 | (2006.01) |
| G11C 29/42 | (2006.01) |

(52) U.S. Cl.
CPC .......... *G11C 16/10* (2013.01); *G11C 11/5628* (2013.01); *G11C 16/0483* (2013.01); *G11C 16/08* (2013.01); *G11C 16/3459* (2013.01); *G11C 29/42* (2013.01); *G11C 29/44* (2013.01); *G11C 29/52* (2013.01); *G11C 2211/5621* (2013.01); *G11C 2211/5641* (2013.01); *G11C 2216/14* (2013.01)

(58) Field of Classification Search
CPC ..... G11C 16/10; G11C 16/0483; G11C 16/08; G11C 16/3459; G11C 11/0483; G11C 29/42; G11C 29/44; G11C 29/52
See application file for complete search history.

(56) References Cited

U.S. PATENT DOCUMENTS

| 8,054,684 B2 | 11/2011 | Gorobets et al. | |
| 9,767,910 B1 | 9/2017 | Bushnaq et al. | |
| 2013/0148436 A1* | 6/2013 | Kurosawa | G11C 16/26 365/185.24 |
| 2013/0332659 A1* | 12/2013 | Maejima | G11C 16/10 711/103 |

(Continued)

FOREIGN PATENT DOCUMENTS

JP 2015195071 A 11/2015

*Primary Examiner* — Toan K Le

(74) *Attorney, Agent, or Firm* — Kim & Stewart LLP

(57) ABSTRACT

A memory system includes a memory unit with a plurality of first memory cells connected to a first word line and a memory controller to control the memory unit to write data in page units equal in size to the number of first memory cells. The memory unit is configured to write a plurality of pages of data to the plurality of first memory cells and then read each page of data thus written. The memory controller determines whether or not each page of data, as read from the plurality of first memory cells, satisfies a predetermined condition, and registers a determination result for each page indicating whether the predetermined condition was satisfied.

20 Claims, 21 Drawing Sheets

(56) References Cited

U.S. PATENT DOCUMENTS

| | | |
|---|---|---|
| 2015/0269992 A1 | 9/2015 | Hara et al. |
| 2016/0012916 A1* | 1/2016 | Hara .................... G11C 29/06 |
| | | 714/718 |
| 2016/0098197 A1 | 4/2016 | Kuo et al. |
| 2017/0024276 A1 | 1/2017 | Kanno |
| 2017/0046225 A1* | 2/2017 | Yang ................... G11C 11/5628 |
| 2018/0061489 A1* | 3/2018 | Shibata ............... G11C 11/5628 |
| 2018/0075902 A1* | 3/2018 | Shirakawa .......... G06F 11/1068 |
| 2018/0138923 A1* | 5/2018 | Koizumi .............. H03M 13/611 |
| 2019/0065114 A1* | 2/2019 | Inoue ................... G06F 3/0635 |

\* cited by examiner

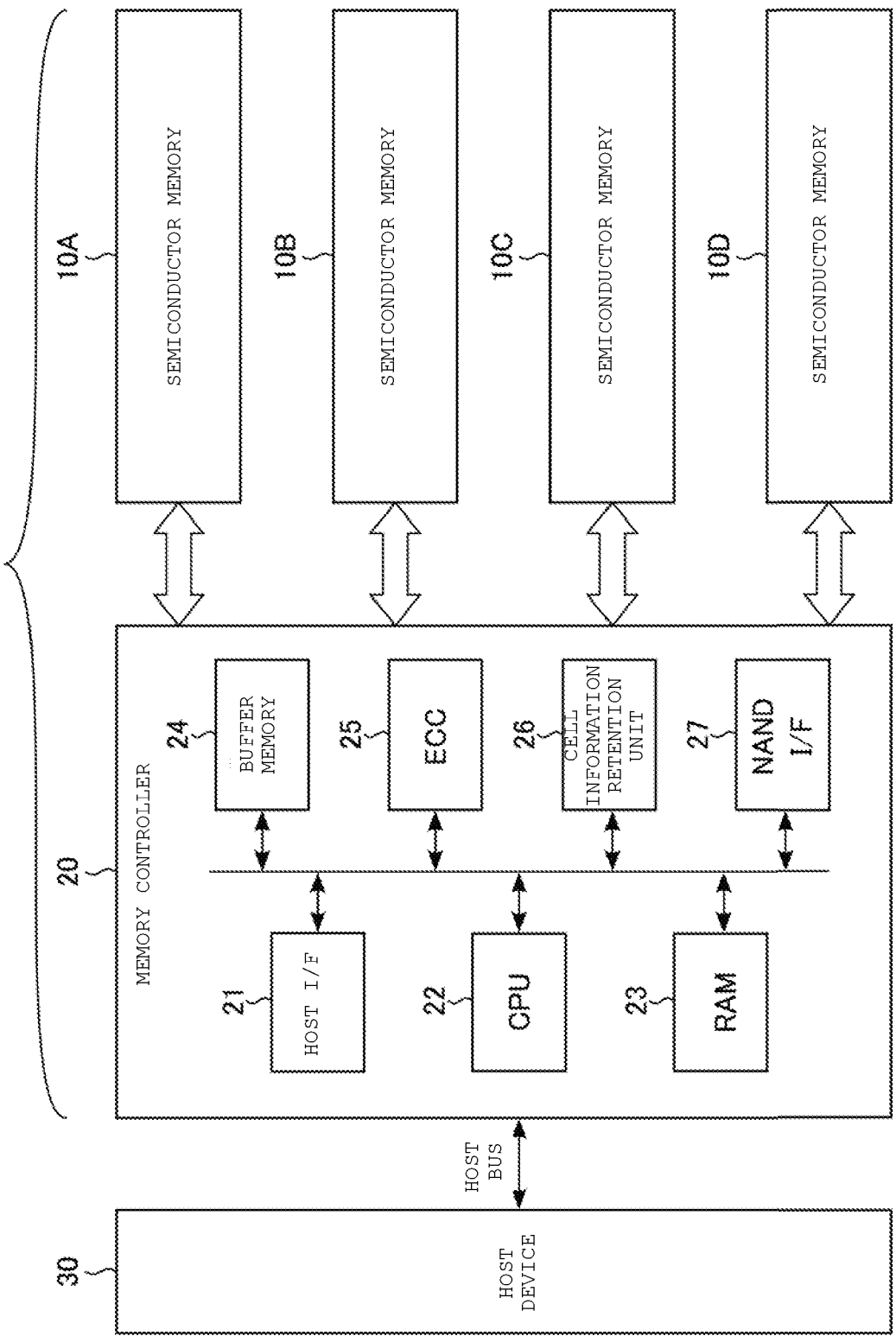

MEMORY SYSTEM

CROSS-REFERENCE TO RELATED APPLICATIONS

This application is based upon and claims the benefit of priority from Japanese Patent Application No. 2018-021958, filed Feb. 9, 2018, the entire contents of which are incorporated herein by reference.

FIELD

Embodiments described herein relate generally to a memory system.

BACKGROUND

There are NAND flash memories in which memory cells are stacked 3-dimensionally.

DESCRIPTION OF THE DRAWINGS

FIG. 21 is a block diagram illustrating a memory system according to a modification of the first embodiment.

DETAILED DESCRIPTION

Figure 1:
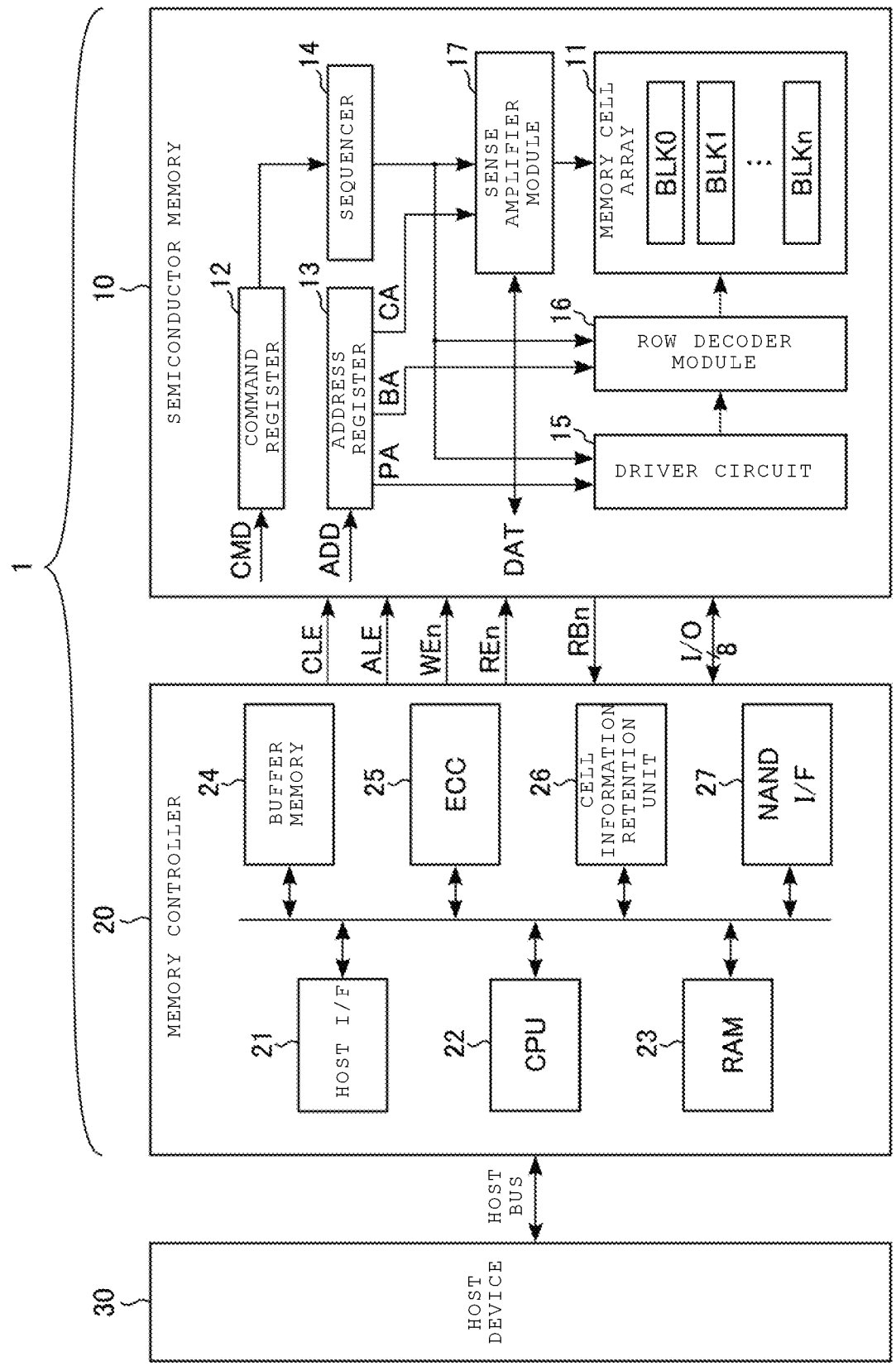
FIG. 1 is a block diagram of a memory system according to a first embodiment.

In general, according to one embodiment, a memory system, comprises a semiconductor memory that includes a plurality of first memory cells connected to a first word line and a memory controller configured to control the semiconductor memory to write data to the semiconductor memory in page units equal in size to the number of first memory cells in the plurality of first memory cells. The semiconductor memory is configured to write a plurality of pages of data from the write data to the plurality of first memory cells and then read each page in the plurality of pages of data written to the plurality of first memory cells. The memory controller is configured to determine whether each page in the plurality of pages of data as read from the plurality of first memory cells satisfies a predetermined condition and register a determination result for each page in the plurality pages of data indicating whether the predetermined condition was satisfied.

Hereinafter, example embodiments will be described with reference to the drawings. The drawings are schematic. These examples embody the technical concepts of the present disclosure, but are not to be considered limiting of the scope of the present disclosure. In the following description, the same reference numerals are given to elements that have substantially the same functions and configurations. When numbers are provided after letters in the reference labels (e.g., SU0 and SU1) the numbers are used to distinguish instances of elements having substantially the same configurations as each other. When it is not necessary to distinguish between multiple instances of these elements, the elements may be referred to by use of only the letter portion of the reference label (e.g., SU for both or either of SU0 and SU1).

1. First Embodiment

Hereinafter, a memory system according to a first embodiment will be described.

1-1 Configuration
1-1-1 Overall Configuration of Memory System

FIG. 1 illustrates a configuration of a memory system 1 according to a first embodiment. As illustrated in FIG. 1, the memory system 1 includes a semiconductor memory 10 and a memory controller 20.

Configuration of Semiconductor Memory 10

The semiconductor memory 10 is a NAND flash memory capable of storing data in a nonvolatile manner. As illustrated in FIG. 1, the semiconductor memory 10 includes a memory cell array 11, a command register 12, an address register 13, a sequencer 14, a driver circuit 15, a row decoder module 16, and a sense amplifier module 17.

The memory cell array 11 includes a plurality of blocks BLK0 to BLKn (where n is an integer equal to or greater than 1). Each block BLK is a group of nonvolatile memory cells and is an erasing unit of data. Embodiments are not limited erasing in block BLK units and other erasing operations are disclosed in U.S. patent application Ser. No. 13/235,389, filed on Sep. 18, 2011, titled "NONVOLATILE SEMICONDUCTOR STORAGE DEVICE," and U.S. patent application Ser. No. 12/694,690, filed on Jan. 27, 2010, and titled "NONVOLATILE SEMICONDUCTOR STORAGE DEVICE." The entire content of these applications is incorporated herein by reference.

In the memory cell array 11, a plurality of bit lines and a plurality of word lines are provided, and each memory cell is associated with one bit line and one word line.

The command register 12 retains a command CMD from the memory controller 20 received by the semiconductor memory 10. Possible commands CMD include, without limitation, a command for causing the sequencer 14 to execute a read operation or a command for causing the sequencer 14 to execute a write operation.

The address register 13 retains address information ADD received by the semiconductor memory 10 from the memory controller 20. The address information ADD may include a block address BA, a page address PA, and a column address CA. The block address BA is used to select the particular block BLK including those memory cells which are targets of various commanded operations. The page address PA is used to select word lines associated with the targeted memory cells. The column address CA is used to select bit lines associated with the target memory cells.

The sequencer 14 controls operations of semiconductor memory 10 based on the command CMD in the command register 12. For example, the sequencer 14 controls the driver circuit 15, the row decoder module 16, and the sense amplifier module 17 to execute an operation of writing data DAT (received from the memory controller 20) to the memory cell array 11 and an operation of reading data DAT stored in the memory cell array 11.

The driver circuit 15 generates a voltage under the control of the sequencer 14. The driver circuit 15 applies, via corresponding signal lines, one voltage for the selected word lines and another voltage for unselected word lines according to the address PA retained in the address register 13.

For example, the row decoder module 16 selects one particular block BLK based on the block address BA retained in the address register 13. Then, the row decoder module 16 applies voltages (generated by the driver circuit 15) to each signal line for the selected word lines and the unselected word lines.

The sense amplifier module 17 applies a desired voltage to each bit line according to the write data DAT received from the memory controller 20. The sense amplifier module 17 determines data stored in memory cells based on the voltages of the bit lines and transmits the determined read data DAT to the memory controller 20.

Configuration of Memory Controller 20

The memory controller 20 commands the semiconductor memory 10 to execute reading, writing, and erasing in response to commands from the host device 30. As illustrated in FIG. 1, the memory controller 20 includes a host interface circuit 21 ("HOST I/F"), a central processing unit (CPU) 22, a random access memory (RAM) 23, a buffer memory 24, an error correction code (ECC) circuit 25, a cell information retention unit 26, and a NAND interface circuit 27 ("NAND I/F").

The host interface circuit 21 is connected to an external host device 30 via a host bus and controls transmissions of data, commands, and addresses between the memory controller 20 and the host device 30. The host interface circuit 21 supports, for example, a communication interface standard such as Serial Advanced Technology Attachment (SATA), Serial Attached SCSI (SAS), or PCI Express® (PCIe).

The CPU 22 controls overall operation of the memory controller 20. For example, the CPU 22 issues a write command in response to a write command received from the host device 30. The CPU 22 executes various processes to manage a memory space of the semiconductor memory 10, such as wear leveling, for example.

The RAM 23 is a volatile memory such as a dynamic random access memory (DRAM). The RAM 23 is used as a working area of the CPU 22. For example, the RAM 23 retains firmware used to manage the semiconductor memory 10, assorted management tables, and counting results, incrementing variables, or the like used or generated in various operations. The management tables include, for example, the number of W/E cycles (write-erase cycles). The number of W/E cycles is managed, for example, in units of blocks BLK and indicates the number of times a pair of writing and erasing operations has been executed on each block BLK.

The buffer memory 24 temporarily retains read data received by the memory controller 20 from the semiconductor memory 10, write data received from the host device 30, and the like.

The ECC circuit 25 executes an error correction processing on data. Specifically, in a write operation, the ECC circuit 25 generates a parity bit based on write data received from the host device 30 and adds the generated parity bit to write data. In a read operation, the ECC circuit 25 detects and corrects an error in the read data using the parity information.

The cell information retention unit 26 retains cell information regarding the number of bits of data that can be stored by a memory cell associated with particular addresses. The cell information is stored along in, for example, a flash translation layer (FTL) and can be appropriately updated in response to a write operation. A nonvolatile memory or a volatile memory may be used as the cell information retention unit 26. The cell information may be collectively managed in the RAM 23 or saved in the semiconductor memory 10.

The NAND interface circuit 27 controls transmission of data, a command, and an address between the memory controller 20 and the semiconductor memory 10 and supports a NAND interface standard. For example, the NAND interface circuit 27 transmits and receives input and output signals (signals I/O) by transmitting a command latch enable signal CLE, an address latch enable signal ALE, a write enable signal WEn, and a read enable signal Ren, and receiving a ready/busy signal RBn.

The signal CLE is a signal used to notify the semiconductor memory 10 that a received signal I/O is the command CMD. The signal ALE is a signal used to notify the semiconductor memory 10 that a received signal I/O is the address information ADD. The signal WEn is a signal used to command the semiconductor memory 10 to receive the signal I/O as write data. The signal REn is a signal used to command the semiconductor memory 10 to output the read data as the signal I/O. The signal RBn is a signal used to notify the memory controller 20 of a ready state in which the semiconductor memory 10 can receive a command from the memory controller 20 or a busy state in which the semiconductor memory 10 cannot receive a command. The signal I/O is, for example, an 8-bit signal and can include the command CMD, the address information ADD, the write data DAT, or the read data.

The semiconductor memory 10 and the memory controller 20 described above may be combined to form one semiconductor device. For example, a memory card such as an SD™ card or a solid state drive (SSD) can be such a semiconductor device.

1-1-2 Configuration of Memory Cell Array 11
Circuit Configuration

Figure 2:
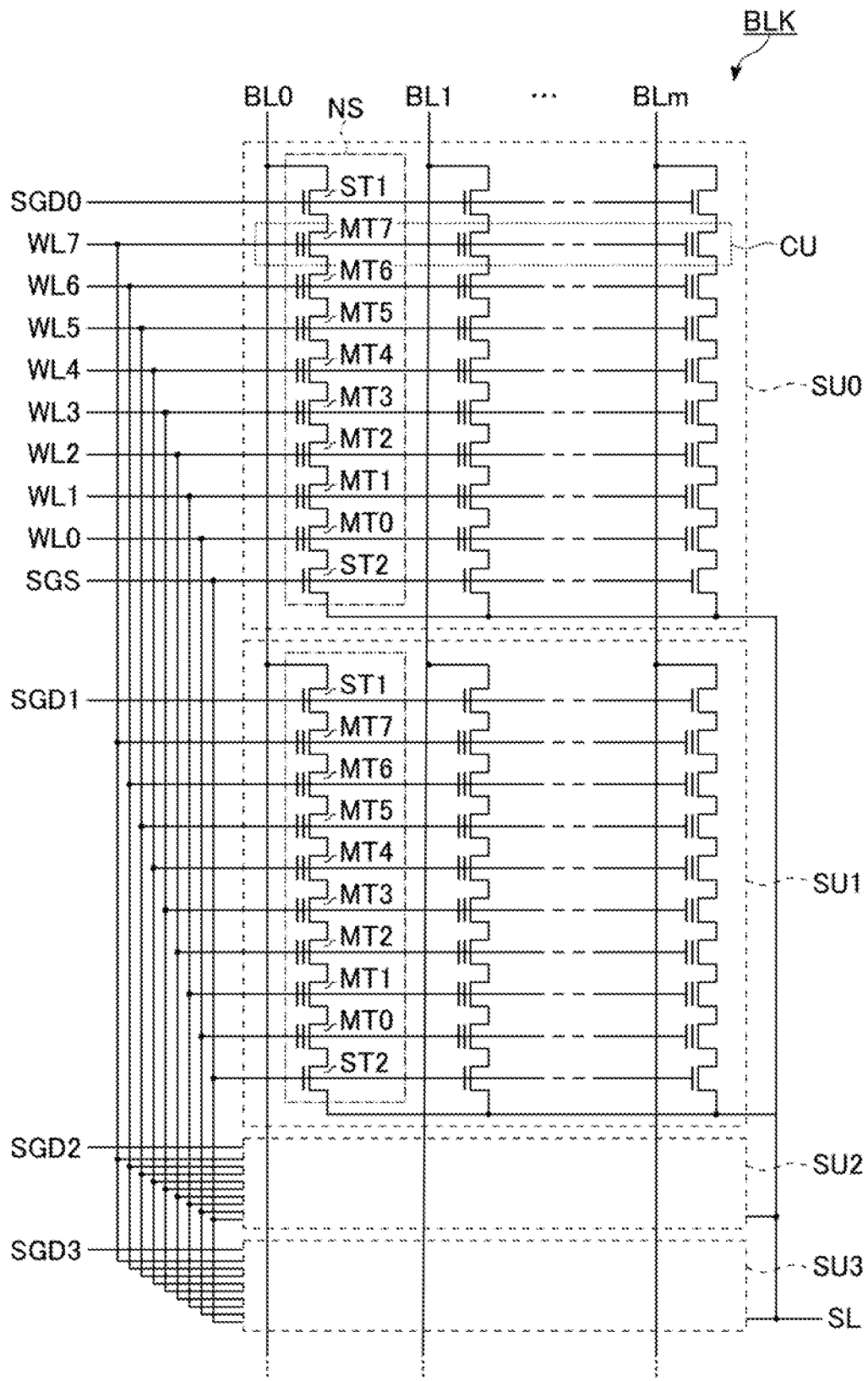
FIG. 2 is a circuit diagram of a memory cell array in a semiconductor memory according to a first embodiment.

FIG. 2 illustrates an example of a circuit configuration of the memory cell array 11 in the semiconductor memory 10 according to the first embodiment. Hereinafter, the circuit configuration of the memory cell array 11 according to the first embodiment will be described focusing on one block BLK.

Each block BLK includes, for example, 4 string units SU0 to SU3, as illustrated in FIG. 2. Each string unit SU includes a plurality of NAND strings NS respectively associated with bit lines BL0 to BLm (where m is an integer equal to or greater than one). For example, the NAND string NS includes eight memory cell transistors MT0 to MT7 and select transistors ST1 and ST2.

The memory cell transistor MT includes a control gate and a charge storage layer and retains data in nonvolatile manner. The memory cell transistors MT0 to MT7 in each NAND string NS are connected in series between the source of the select transistor ST1 and the drain of the select transistor ST2. Control gates of each memory cell transistor MT0 to MT7 within the same block BLK are respectively connected in to word lines WL0 to WL7. That is, each memory cell transistor MT0 in a block BLK is connected to the same word line (WL0), each memory cell transistor MT1 in the block BLK is connected to the same word line (WL1), and etc.

The select transistors ST1 and ST2 are used to select particular string units SU in various operations. The gate of the select transistors ST1 in each of the string units SU0 to SU3 in the same block BLK is connected in to a corresponding one of the select gate lines SGD0 to SGD3. The drains of the select transistors ST1 in the same column of a block BLK are connected to the corresponding bit line BL for the respective column. The gates of the select transistors ST2 in the same block BLK are connected in common to a select gate line SGS. The sources of the select transistors ST2 in each block BLK are connected in common to a source line SL between the plurality of blocks BLK.

The memory cell transistors MT connected to a common word line WL within one string unit SU are referred to as a cell unit CU. In the cell unit CU, storage capacitance varies according to the number of bits of data stored by the memory cell transistors MT. For example, the cell unit CU stores 1-page data when each of the plurality of memory cell transistors MT in the cell unit CU stores 1-bit data. The cell unit CU stores 2-page data when each of the plurality of memory cell transistors MT in the cell unit CU stores 2-bit data.

In the semiconductor memory 10 according to the first embodiment, the number of bits of data stored by one memory cell may differ for each memory cell. Hereinafter, the cell unit CU in which the memory controller 20 causes each memory cell transistor MT to store 1-bit data is referred to as a single-level cell (SLC). A cell unit CU in which each memory cell transistor MT stores 2-bit data is referred to as a multi-level cell (MLC). A cell unit CU in which each memory cell transistor MT stores 3-bit data is referred to as a triple-level cell (TLC). A cell unit CU in which each memory cell transistor MT stores 4-bit data is referred to as a quadruple-level cell (QLC).

Planar Layout

Figure 3:
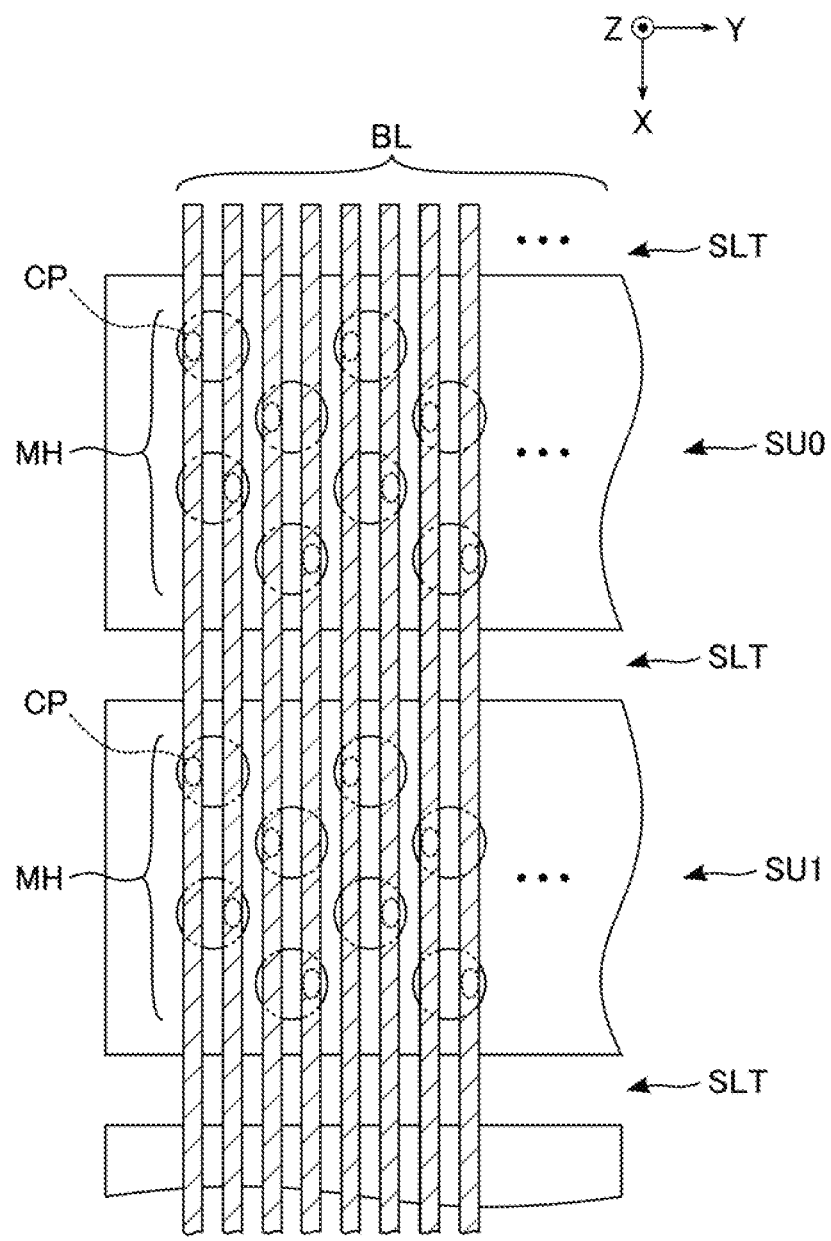
FIG. 3 is a planar layout of a memory cell array in a semiconductor memory according to a first embodiment.

FIG. 3 illustrates a planar layout of the memory cell array 11 according to the first embodiment and X, Y, and Z axes. The string units SU are arranged along the X direction, as illustrated in FIG. 3. Each string unit SU extends with bit lines BL spaced along the Y direction Each string unit SU includes a plurality of memory pillars MH. The plurality of memory pillars MH are arranged in zigzags, along the Y direction. In each memory pillar MH at least one bit line BL is provided to overlap (be positioned above the memory pillar MH in the Z direction). For each string unit SU, each memory pillar MH is electrically connected to one bit line BL by a contact plug CP between the bit line BL and the memory pillar MH.

In the memory cell array 11 a plurality of slits SLT are provided. The slits SLT each extend along the Y direction and the plurality of slits SLT are between adjacent string units SU in the X direction. For example, a single string unit SU is provided between a pair of slits SLT in the X direction. However, the number of string units SU provided between adjacent slits SLT is not limited to one, and any number can be selected.

Cross-Sectional Structure

Figure 4:
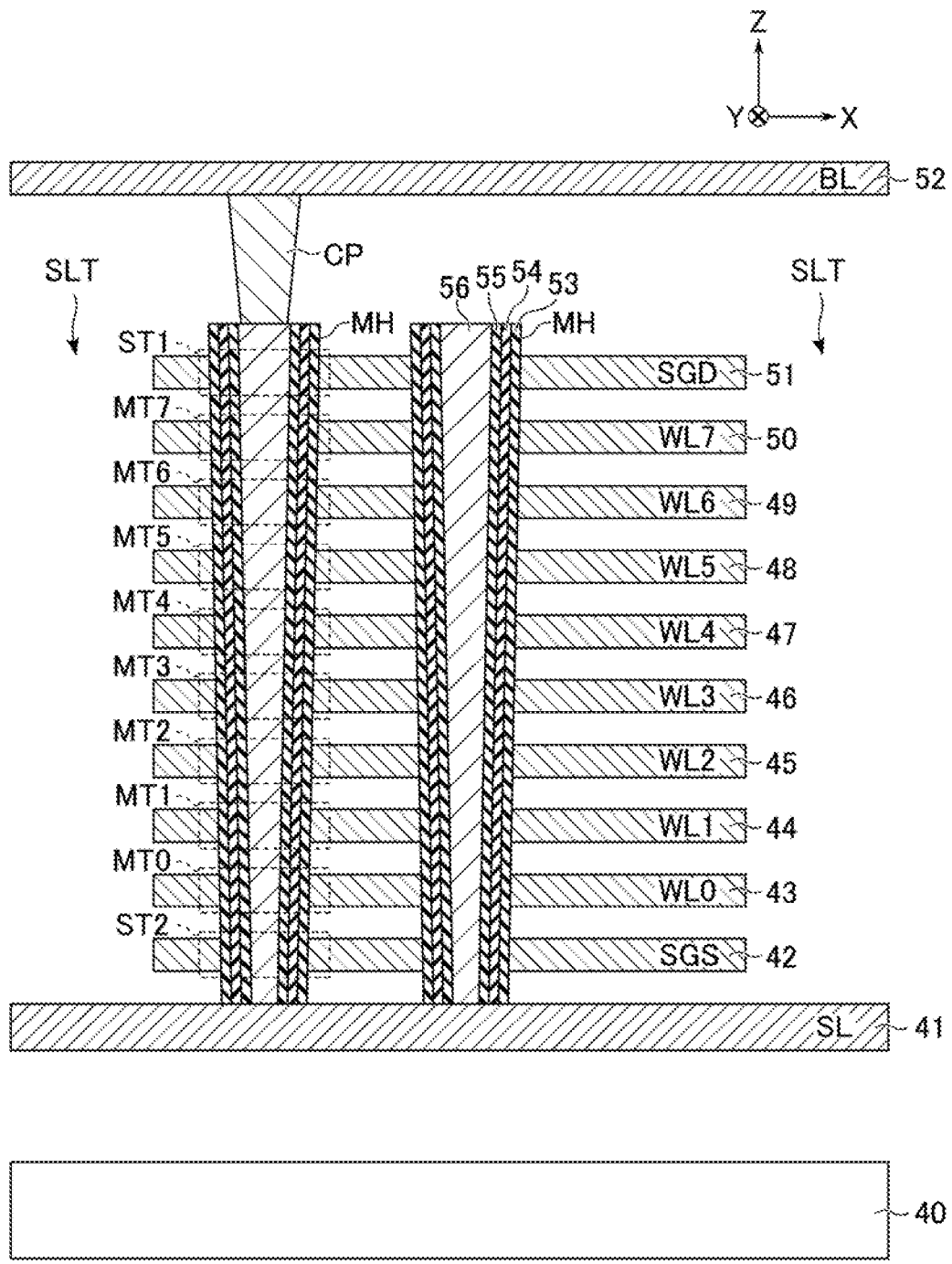
FIG. 4 is a cross-sectional view of a memory cell array in a semiconductor memory according to a first embodiment.

FIG. 4 illustrates an example of a cross-sectional structure of the memory cell array 11 according to the first embodiment. In FIG. 4, an inter-layer insulating films present in an actual device between various conductive layers (e.g., elements 42 to 52) is not depicted for sake of explanatory convenience. As illustrated in FIG. 4, the memory cell array 11 includes a semiconductor substrate 40, conductors 41 to 48, the memory pillar MH, and the contact plug CP.

The surface of the semiconductor substrate 40 is provided in parallel to the XY plane. A conductor 41 is provided above the semiconductor substrate 40 with an insulating film interposed therebetween. The conductor 41 is formed in a planar element parallel to the XY plane and functions as a source line SL. On the conductor 41, the slits SLT, each parallel to the YZ plane, are arranged along the X direction from each other. The structure on the conductor 41 between the mutually adjacent slits SLT corresponds to one string unit SU, as depicted.

Specifically, on the conductor 41 and between a pair of adjacent slits SLT, conductors 42 to 51 are provided in sequence as layers above the semiconductor substrate 40 spaced from each other along the Z direction. As noted, inter-layer insulating films are between the stacked conductors 42 to 51. The conductors 42 to 51 are each formed in a planar shape parallel to the XY plane. The conductor 42 functions as a select gate line SGS, the conductors 43, 44, 45, 46, 47, 48, 49, and 50 each function, respectively, as the word lines WL0 to WL7, and the conductor 51 functions as the select gate line SGD.

Each of memory pillars MH functions as one NAND string NS. Each memory pillar MH passes through the stack of conductors 42 to 51 and reaches from the upper surface of the conductor 51 to the upper surface of the conductor 41.

The memory pillar MH includes, for example, a block insulating film 53, an insulating film 54, a tunnel oxidation film 55, and a conductive semiconductor material 56. The block insulating film 53 is provided on an inner wall of a memory hole in which the memory pillar MH is formed. The insulating film 54 is provided on the block insulating film 53 and functions as a charge storage layer of the memory cell transistors MT. The tunnel oxidation film 55 is provided on the insulating film 54. The semiconductor material 56 is provided on the tunnel oxidation film 55, so that a current path of the NAND string NS is formed in the semiconductor material 56. Additional materials may be formed on the semiconductor material 56 in some embodiments.

An intersection between the memory pillar MH and the conductor 42 functions as the select transistor ST2. Respective intersections between the memory pillar MH and the conductors 43 to 50 function as the memory cell transistors MT0 to MT7. An intersection between the memory pillar MH and the conductor 51 functions as the select transistor ST1.

The conductor 52 is provided in a layer above the upper surface of the memory pillar MH with an inter-layer insulating film interposed therebetween. The conductor 52 is formed in a line shape extending in the X direction and functions as the bit line BL. A plurality of conductors 52 are arranged in the Y direction (see FIG. 3, bit lines BL) and the conductor 52 is electrically connected to a single memory pillar MH in each string unit SU.

Specifically, in each string unit SU a conductive contact plug CP is provided on the semiconductor material 56 of a memory pillar MH to connect to one conductor 52; however, embodiments are not limited thereto. The memory pillar MH and the conductor 52 may be connected with a plurality of contact plugs, wirings, or the like interposed therebetween.

The configuration of the memory cell array 11 is not limited to the foregoing configuration. For example, any number of string units SU in each block BLK can be used. Any number of memory cell transistors MT and any number of select transistors ST1 and ST2 in each NAND string NS can be used.

The numbers of word lines WL and select gate lines SGD and SGS change based on the numbers of the memory cell transistors MT and select transistors ST1 and ST2. A plurality of conductive layers 42 may be allocated to the select gate line SGS or a plurality of conductive layers 51 may be allocated to the select gate line SGD.

The other configurations of the memory cell array 11 are disclosed in, for example, U.S. patent application Ser. No. 12/407,403, filed on Mar. 19, 2009, and titled "THREE-DIMENSIONALLY STACKED NONVOLATILE SEMICONDUCTOR MEMORY," U.S. patent application Ser. No. 12/406,524, filed on Mar. 18, 2009, and titled "THREE-DIMENSIONALLY STACKED NONVOLATILE SEMICONDUCTOR MEMORY DEVICE," U.S. patent application Ser. No. 12/679,991, filed on Mar. 25, 2010, and titled "NONVOLATILE SEMICONDUCTOR MEMORY AND MANUFACTURING METHOD THEREFOR," and U.S. patent application Ser. No. 12/532,030, filed on Mar. 23, 2009 and titled "SEMICONDUCTOR MEMORY AND MANUFACTURING METHOD THEREFOR," the entire contents of each of the above are incorporated herein by reference.

1-1-3 Configuration of Row Decoder Module 16

Figure 5:
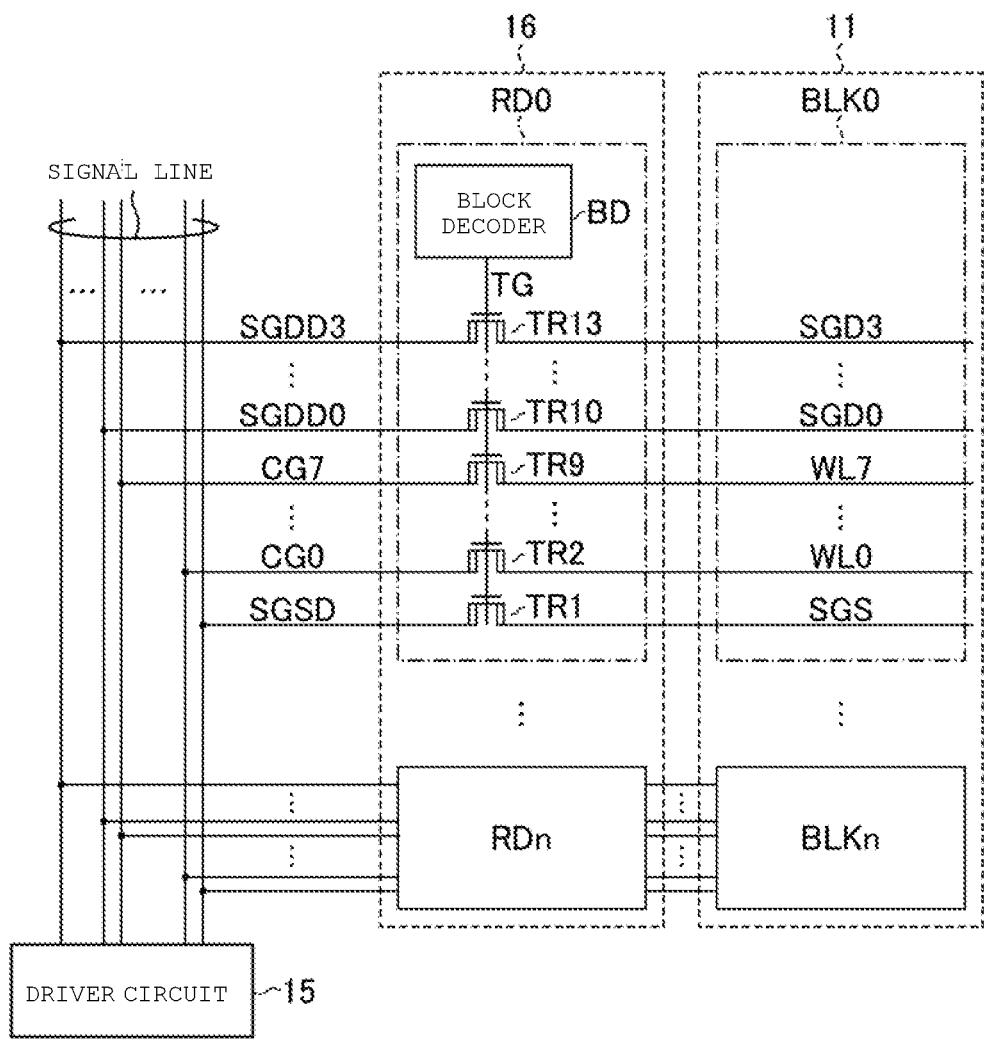
FIG. 5 is a circuit diagram of a row decoder module in a semiconductor memory according to a first embodiment.

FIG. 5 illustrates an example of a circuit configuration of the row decoder module 16 in the semiconductor memory 10 according to the first embodiment. As illustrated in FIG. 5, the row decoder module 16 includes row decoders RD0 to RDn.

The row decoders RD0 to RDn are associated with the blocks BLK0 to BLKn, respectively. That is, one row decoder RD is associated with one block BLK. Hereinafter, a detailed circuit configuration of the row decoder RD will be described focusing on the row decoder RD0 corresponding to the block BLK0.

The row decoder RD includes a block decoder BD and high breakdown voltage n-channel MOS transistors TR1 to TR13. The block decoder BD decodes the block address BA and applies a predetermined voltage to a transmission gate line TG based on a decoding result. The transmission gate line TG is connected in common to the gates of the transistors TR1 to TR13. The transistors TR1 to TR13 are connected between various signal lines wired from the driver circuit 15 and various wirings of the associated block BLK.

Specifically, one end of the transistor TR1 is connected to a signal line SGSD and the other end of the transistor TR1 is connected to the select gate line SGS. One ends of the transistors TR2 to TR9 are respectively connected to the signal lines CG0 to CG7 and the other ends of the transistors TR2 to TR9 are connected to one ends of the word lines WL0 to WL7. One ends of the transistors TR10 to TR13 are connected to signal lines SGDD0 to SGDD3 and the other ends of the transistors TR10 to TR13 are connected to select gate lines SGD0 to SGD3.

In the above-described configuration, the row decoder module 16 can select the block BLK that executes various operations. Specifically, the block decoders BD corresponding to the selected and unselected blocks BLK in the various operations apply voltages with an "H" level and an "L" level to the transmission gate line TG.

For example, when the block BLK0 is selected, the transistors TR1 to TR13 in the row decoder RD0 are turned on and the transistors TR1 to TR13 in the other row decoders RD are turned off. That is, a current path is formed between various wirings provided in the block BLK0 and the corresponding signal lines and a current path is blocked between various wirings provided in the other blocks BLK and the corresponding signal lines. As a result, a voltage applied to each signal line by the driver circuit 15 is applied to each of the various wirings provided in the selected block BLK0 via the row decoder RD0.

1-1-4 Configuration of Sense Amplifier Module 17

Figure 6:
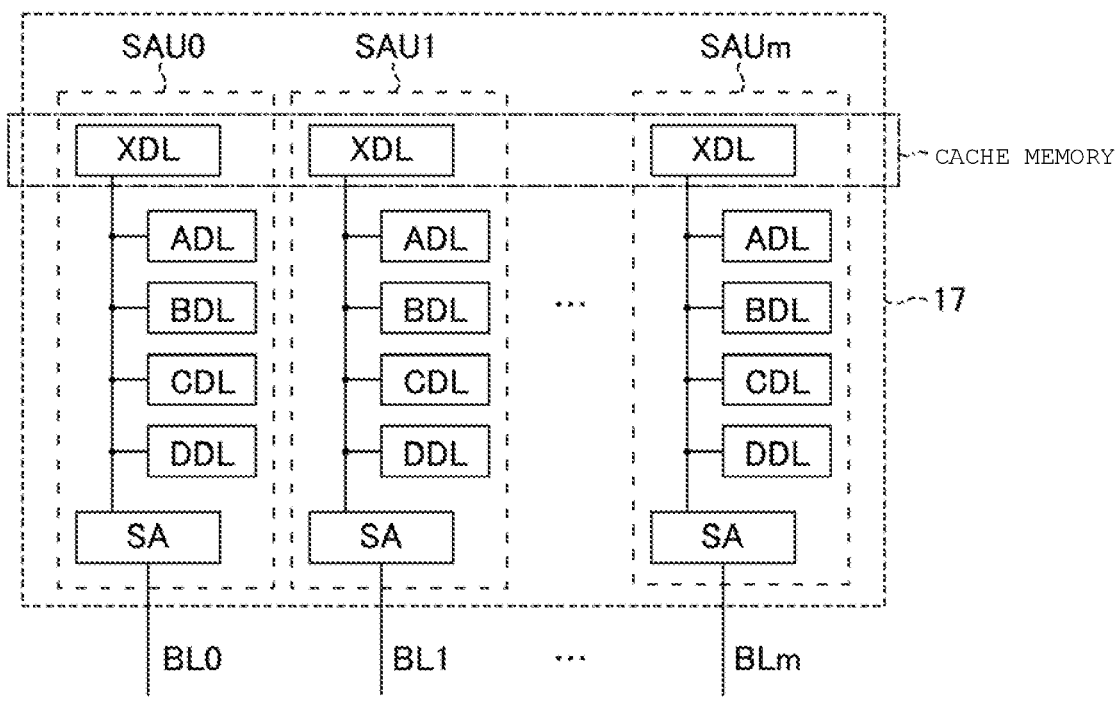
FIG. 6 is a block diagram of a sense amplifier module in a semiconductor memory according to a first embodiment.

FIG. 6 illustrates an example of a configuration of the sense amplifier module 17 according to the first embodiment. As illustrated in FIG. 6, the sense amplifier module 17 includes, for example, sense amplifier units SAU0 to SAUm.

The sense amplifier units SAU0 to SAUm are respectively associated with the bit lines BL0 to BLm. Each sense amplifier unit SAU includes, for example, a sense amplifier unit SA and latch circuits ADL, BDL, CDL, DDL, and XDL. The sense amplifier SA and the latch circuits ADL, BDL, CDL, DDL, and XDL are connected to transmit and receive data one another.

The sense amplifier unit SA senses data read to the corresponding bit line BL, for example, in a read operation and determines whether the read data is "0" or "1." Each of the latch circuits ADL, BDL, CDL, DDL, and XDL temporarily retains read data, write data, or the like.

The latch circuit XDL is connected to an input and output circuit (not illustrated) and is used to input or output data between the sense amplifier unit SAU and the input and output circuit. That is, the latch circuit XDL functions as, for example, a cache memory of the semiconductor memory 10. For example, the semiconductor memory 10 can be in a ready state when the latch circuit XDL is vacant even if the latch circuits ADL, BDL, CDL, and DDL are being used.

Figure 7:
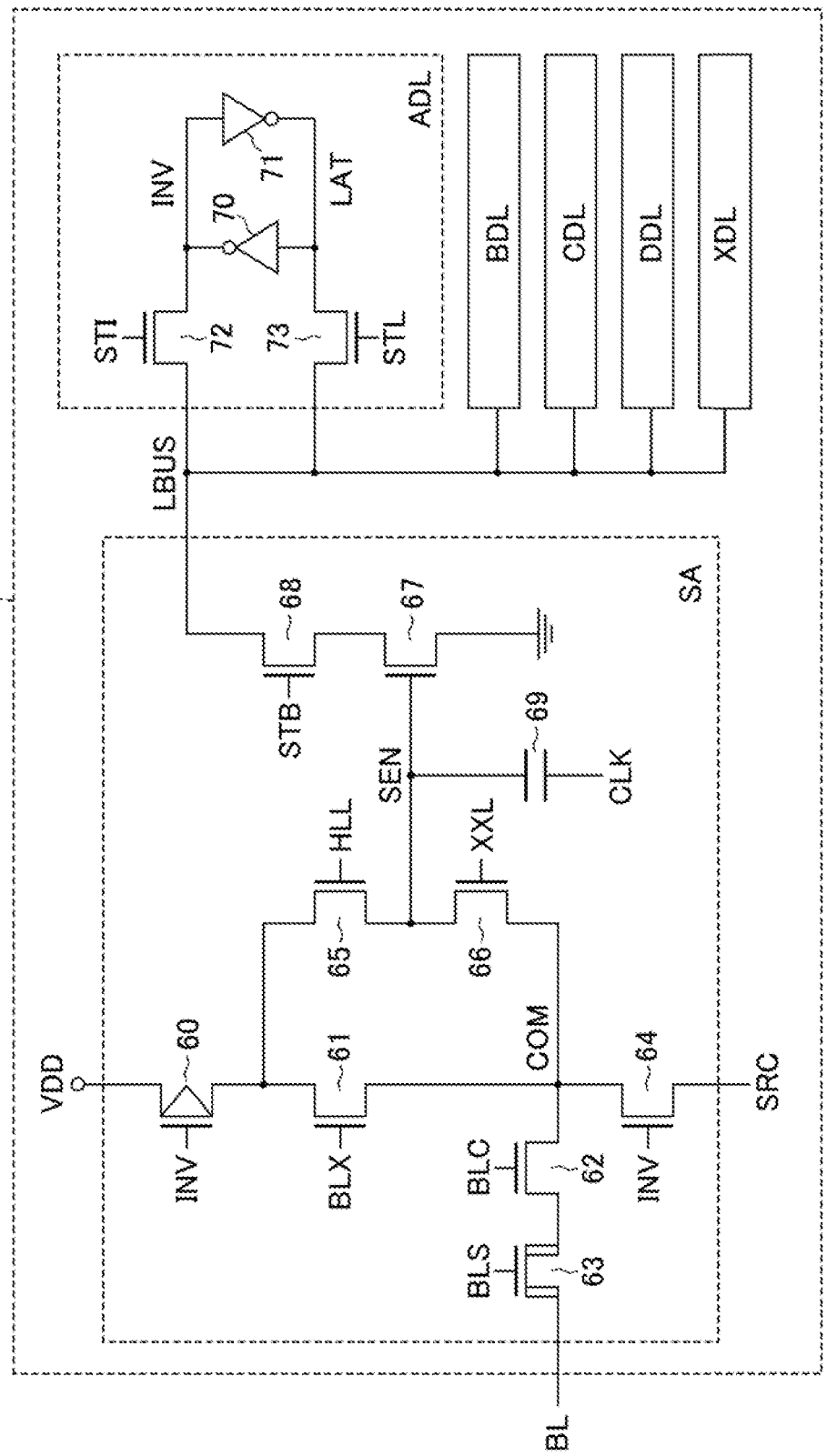
FIG. 7 is a circuit diagram of a sense amplifier module in a semiconductor memory according to a first embodiment.

FIG. 7 illustrates a detailed circuit configuration of a sense amplifier unit SAU. As illustrated in FIG. 7, the sense amplifier unit SA includes a p-channel MOS transistor 60, n-channel MOS transistors 61 to 68, and a capacitor 69. The latch circuit ADL includes inverters 70 and 71 and n-channel MOS transistors 72 and 73. Since the circuit configuration of the latch circuits BDL, CDL, DDL, and XDL is the same as the circuit configuration of the latch circuit ADL, particular description of these will be omitted.

One end of the transistor 60 is connected to a power line and the gate of the transistor 60 is connected to a node INV. For example, a voltage VDD, which is a power supply voltage of the semiconductor memory 10, is applied to the power line connected to the one end of the transistor 60. One end of the transistor 61 is connected to the other end of the transistor 60, the other end of the transistor 61 is connected to a node COM, and a control signal BLX is input to the gate of the transistor 61.

One end of the transistor 62 is connected to the node COM and a control signal BLC is input to the gate of the transistor 62. The transistor 63 is, for example, a high-breakdown voltage n-channel MOS transistor. One end of the transistor 63 is connected to the other end of the transistor 62, the other end of the transistor 63 is connected to the corresponding bit line BL, and a control signal BLS is input to the gate of the transistor 63.

One end of the transistor 64 is connected to the node COM, the other end of the transistor 64 is connected to a node SRC, and the gate of the transistor 64 is connected to the node INV. A voltage VSS, which is, for example, a ground voltage of the semiconductor memory 10, is applied to the node SRC. One end of the transistor 65 is connected to the other end of the transistor 60, the other end of the transistor 65 is connected to a node SEN, and a control signal HLL is input to the gate of the transistor 65.

One end of the transistor 66 is connected to the node SEN, the other end of the transistor 66 is connected to the node COM, and a control signal XXL is input to the gate of the transistor 66. One end of the transistor 67 is grounded and the gate of the transistor 67 is connected to the node SEN.

One end of the transistor 68 is connected to the other end of the transistor 67, the other end of the transistor 68 is connected to a bus LBUS, and a control signal STB is input to the gate of the transistor 68. One end of the capacitor 69 is connected to the node SEN, and a clock CLK (clock signal) is input to the other end of the capacitor 69.

An input node of the inverter 70 is connected to a node LAT and an output node of the inverter 70 is connected to the node INV. An input node of the inverter 71 is connected to the node INV and an output node of the inverter 71 is connected to the node LAT.

One end of the transistor 72 is connected to the node INV, the other end of the transistor 72 is connected to the bus LBUS, and a control signal STI is input to the gate of the transistor 72. One end of the transistor 73 is connected to the node LAT, the other end of the transistor 73 is connected to the bus LBUS, and a control signal STL is input to the gate of the transistor 73.

Each of the above-described control signals BLX, BLC, BLS, HLL, XXL, and STB is generated by, for example, the sequencer 14. A timing at which the sense amplifier unit SA determines data read on the bit line BL is based on the timing at which the control signal STB is asserted.

The sense amplifier module 17 according to the first embodiment is not limited to the above-described configuration and can be modified variously. For example, the number of latch circuits in the sense amplifier unit SAU can be appropriately changed based on the details write scheme to be applied in the memory system 1.

1-1-5 Allocation of Data

Figure 8:
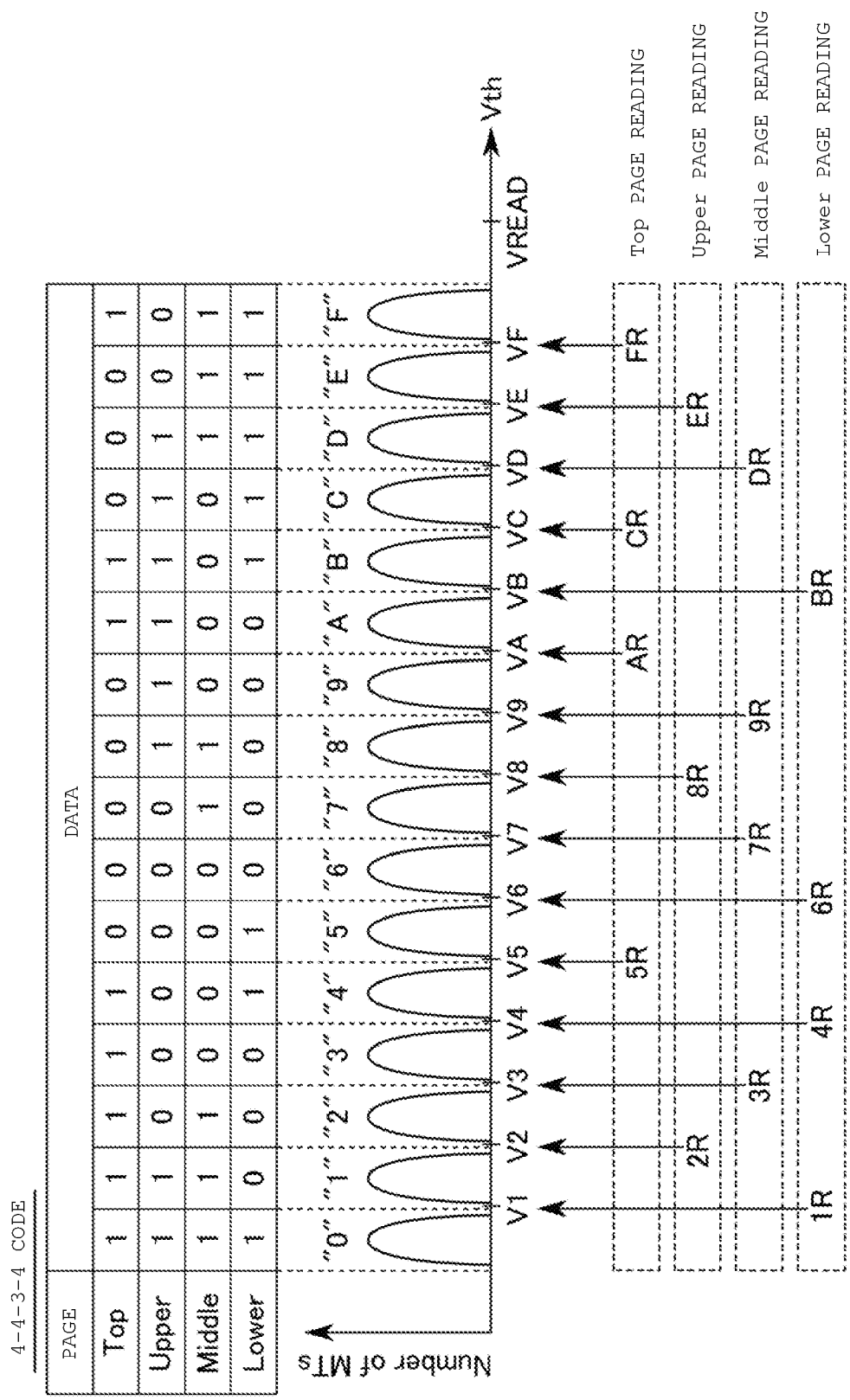
FIG. 8 is a diagram illustrating an example of allocation of data to memory cell transistors according to a first embodiment.

FIG. 8 illustrates examples of a threshold distribution of the memory cell transistors MT, allocation of data, a read voltage, and a verify voltage when a quadruple-level cell (QLC) scheme is applied in accordance with a write scheme for a memory cell.

In the threshold distribution of the memory cell transistors MT illustrated in FIG. 8, the vertical axis corresponds to the number of memory cell transistors MT and the horizontal axis corresponds to a threshold voltage Vth of the memory cell transistors MT. When the QLC scheme is applied, 4-bit data is stored in each memory cell transistor MT and the threshold distribution of the memory cell transistors MT is classified into 16 threshold distributions, as illustrated in FIG. 8.

The 16 threshold distributions in the QLC scheme are referred to as a "0" level, a "1" level, a "2" level, a "3" level, a "4" level, a "5" level, a "6" level, a "7" level, an "8" level, a "9" level, an "A" level, a "B" level, a "C" level, a "D" level, an "E" level, and an "F" level in order starting from a lowest threshold voltage.

The 4-bit data values can be allocated:
the "0" level: "1111 (lower bit/middle bit/upper bit/top bit)" data;
the "1" level: "0111" data;
the "2" level: "0101" data;
the "3" level: "0001" data;
the "4" level: "1001" data;
the "5" level: "1000" data;
the "6" level: "0000" data;
the "7" level: "0100" data;
the "8" level: "0110" data;
the "9" level: "0010" data;
the "A" level: "0011" data;
the "B" level: "1011" data;
the "C" level: "1010" data;
the "D" level: "1110" data;
the "E" level: "1100" data; and
the "F" level: "1101" data.

In the above threshold distributions, each read voltage is set between adjacent threshold distributions. For example, a read voltage 1R is set between a maximum threshold voltage at the "0" level and a minimum threshold voltage at the "1" level. A read voltage 2R is set between a maximum threshold voltage at the "1" level and a minimum threshold voltage at the "2" level. Read voltages 3R, 4R, 5R, 6R, 7R, 8R, 9R, AR, BR, CR, DR, ER, and FR are also set between corresponding adjacent threshold distributions in a manner similar to read voltages 1R and 2R.

When the read voltage 1R is applied to the word line WL, the memory cell transistors MT at the "0" level are turned on and the memory cell transistors in the threshold distribution equal to or greater than the "1" level are turned off. When the read voltage 2R is applied to the word line WL, the memory cell transistors MT in the threshold distributions equal to or less than the "1" level are turned on and the memory cell transistors in the threshold distribution equal to or greater than the "2" level are turned off.

That is, through the read operation in which the read voltage 1R is used, the sense amplifier unit SA determines whether the threshold voltage of the memory cell transistors MT is in the threshold distribution of the "0" level or is in the threshold distributions equal to or greater than the "1" level. Through the read operation in which the read voltage 2R is used, the sense amplifier unit SA determines whether the threshold voltage of the memory cell transistors MT is included in the threshold distribution of the "1" level or is included in the threshold distributions equal to or greater than the "2" level. The same applies below.

A read pass voltage VREAD is set to a voltage higher than the maximum threshold voltage in the threshold distribution of the highest level. When the read pass voltage VREAD is applied to the word line WL, the memory cell transistors MT are turned on irrespective of stored data.

Voltages V1, V2, V3, V4, V5, V6, V7, V8, V9, VA, VB, VC, VD, VE, and VF illustrated in FIG. 8 are respectively verify voltages used for programming of the "0" level, the "1" level, the "2" level, the "3" level, the "4" level, the "5"

level, the "6" level, the "7" level, the "8" level, the "9" level, the "A" level, the "B" level, the "C" level, the "D" level, the "E" level, and the "F" level.

In the write operation, the semiconductor memory 10 ends the programming of the memory cell transistors MT when the semiconductor memory 10 detect that the threshold voltage of the memory cell transistors MT exceeds the verify voltage corresponding to the intended data.

The verify voltage V1 is set between the maximum threshold voltage at the "0" level and the minimum threshold voltage at the "1" level and is located near a lower base of the threshold distribution of the "1" level. The verify voltages V2, V3, V4, V5, V6, V7, V8, V9, VA, VB, VC, VD, VE, and VF are set similarly.

When the above-described allocation of the data is applied, lower page data is determined according to a read result obtained using the read voltages 1R, 4R, 6R, and BR. Middle page data is determined according to a read result obtained using the read voltages 3R, 7R, 9R, and DR. Upper page data is determined according to a read result obtained using the read voltages 2R, 8R, and ER. Top page data is determined according to a read result obtained using the read voltages 5R, AR, CR, and FR.

The allocation of the data illustrated in FIG. 8 is referred to as a "4-4-3-4 code" since the lower page data, the middle page data, the upper page data, and the top page data are determined through readings executed four times, four times, three times, and four times, respectively.

1-2 Operation

In a write operation of the memory system 1 according to the first embodiment, the QLC scheme is applied as the write scheme. The memory system 1 according to the first embodiment uses, for example, the "4-4-3-4 code" illustrated in FIG. 8 as allocation of data values.

The semiconductor memory 10 according to the first embodiment repeatedly executes a program loop in the write operation. The program loop includes a program operation and a verify operation. The program operation is an operation of increasing a threshold voltage of particular memory cell transistors MT. The verify operation is an operation of determining whether the threshold voltage of these memory cell transistors MT exceeds the desired voltage.

The semiconductor memory 10 according to the first embodiment executes a read operation of confirming whether written data can be correctly read after a write operation is completed on, for example, one cell unit CU based on an instruction from the memory controller 20. Hereinafter, this series of operations is referred to as a first operation and the read operation executed in the first operation is referred to as a determination reading. The memory controller 20 determines a state of the cell unit CU based on a result of the determination reading and causes the cell information retention unit 26 to retain a determination result (cell information).

Figure 9:
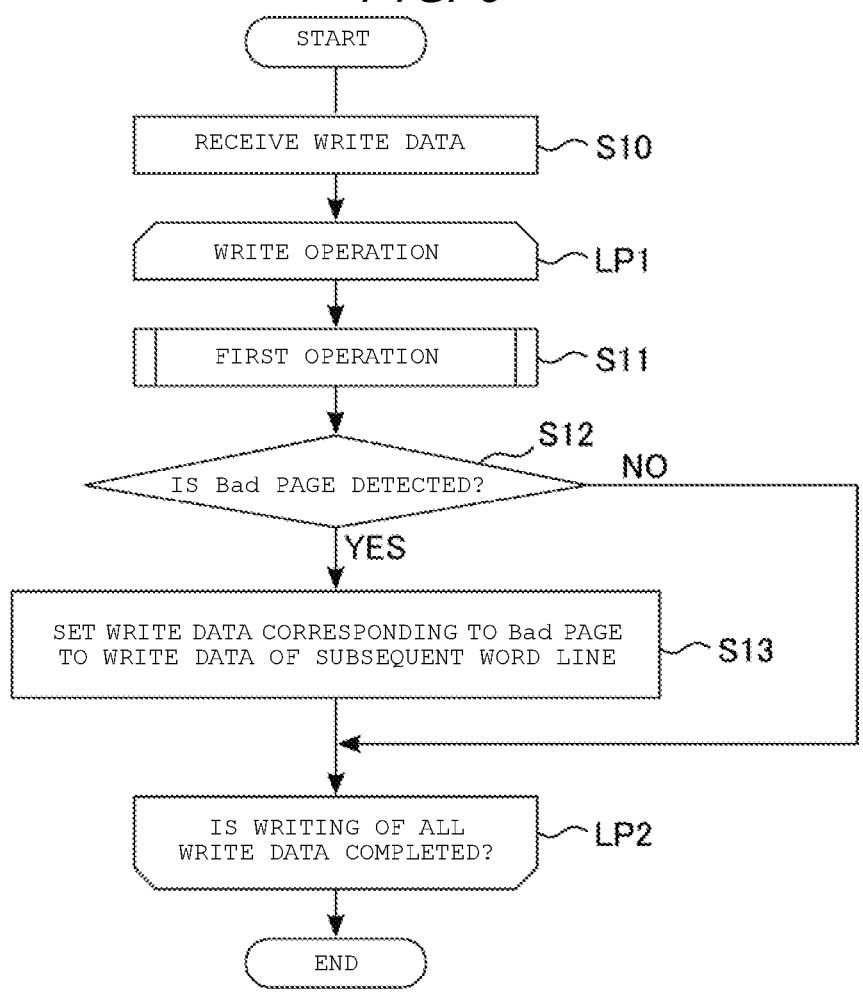
FIG. 9 is a flowchart of a write operation of a memory system according to a first embodiment.

Hereinafter, details of the write operation in the memory system 1 according to the first embodiment will be described with reference to FIG. 9. FIG. 9 illustrates an example of a write operation in the memory system 1 according to the first embodiment.

As illustrated in FIG. 9, the memory controller 20 first receives an instruction/command for the write operation along with write data from the host device 30 via the host interface circuit 21 (step S10). The just received write data is retained in, for example, the buffer memory 24. Then, the CPU 22 instructs the semiconductor memory 10 to execute the write operation in units of 4 pages based on an instruction from the host device 30 (loop LP1).

Figure 10:
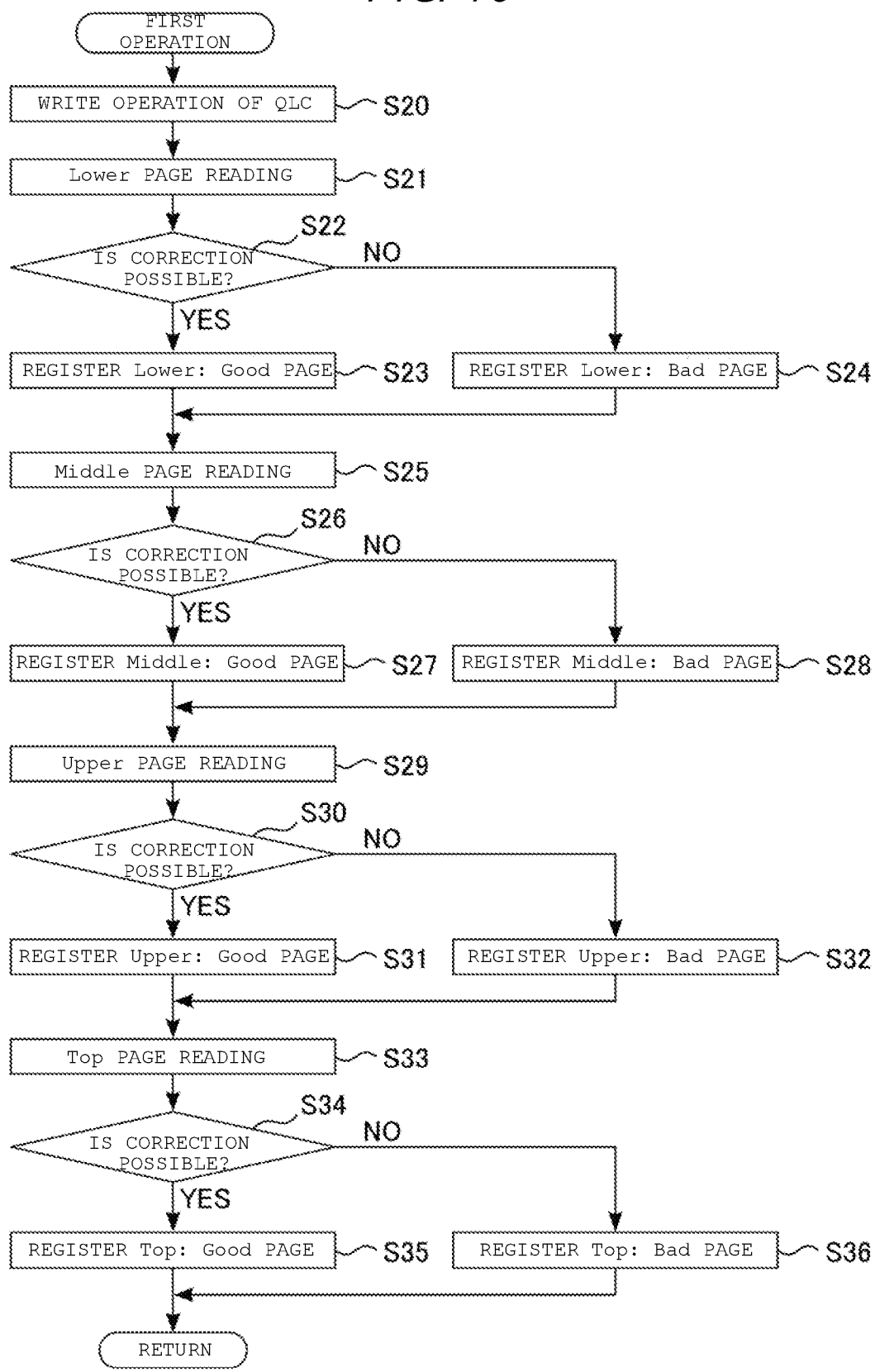
FIG. 10 is a flowchart of a first operation of a memory system according to a first embodiment.

Specifically, in the loop LP1, the memory system 1 executes the first operation (step S11). FIG. 10 illustrates an example of a flowchart of the first operation of the memory system 1 according to the first embodiment.

As illustrated in FIG. 10, the memory system 1 first executes the write operation of the QLC scheme (step S20). Specifically, the memory controller 20 transmits the command CMD to give a write operation, the address information ADD for designating the cell unit CU caused to store data, and the write data DAT of four pages to the semiconductor memory 10. Then, the semiconductor memory 10 executes the write operation of 4-page data to which the 4-4-3-4 code is applied on the corresponding cell unit CU based on the received command CMD, address information ADD, and write data DAT. In other words, the semiconductor memory 10 executes a write operation of the 4-page data for which one word line WL and one string unit SU are selected.

Subsequently, the memory system 1 executes the lower page reading (step S21). Specifically, the memory controller 20 transmits the command CMD to instruct a read operation and the address information ADD for designating a lower page in the cell unit CU on which the write operation was executed in step S20, to the semiconductor memory 10. Then, the semiconductor memory 10 executes the lower page reading of the cell unit CU based on the received command CMD and address information ADD. Then, the read lower page data is transmitted to the memory controller 20 and the ECC circuit 25 executes error correction on the lower page data.

When the error correction on the read lower page data is possible (YES in step S22), the CPU 22 determines that the page is a good page and causes the cell information retention unit 26 to retain this determination result in association with the address of the lower page (step S23).

Conversely, when the error correction on the read lower page data fails (NO in step S22), the CPU 22 determines that the page is a bad page and causes the cell information retention unit 26 to retain this determination result in association with the address of the lower page (step S24).

Hereinafter, the retention of the result determined as the good page by the CPU 22 in the cell information retention unit 26 in association with the address of the page is referred to as registration of the page as a good page. The retention of the result determined as the bad page by the CPU 22 in the cell information retention unit 26 in association with the address of the page is referred to as registration of the page as the bad page.

Subsequently, the memory system 1 executes the middle page reading (step S25). Specifically, the memory controller 20 transmits the command CMD instructing a read operation and the address information ADD for designating a middle page in the cell unit CU on which the write operation was executed in step S20, to the semiconductor memory 10. Then, the semiconductor memory 10 executes the middle page reading of the cell unit CU based on the received command CMD and address information ADD. Then, the read middle page data is transmitted to the memory controller 20 and the ECC circuit 25 executes error correction on the middle page data.

When the error correction on the read middle page data is possible (YES in S26), the CPU 22 registers the page as a good page (step S27). Conversely, when the error correction of the read middle page data fails (NO in step S26), the CPU 22 registers the page as a bad page (step S28).

Subsequently, the memory system 1 executes the upper page reading (step S29). Specifically, the memory controller 20 transmits the command CMD instructing a read operation and the address information ADD for designating a upper page in the cell unit CU on which the write operation was executed in step S20, to the semiconductor memory 10. Then, the semiconductor memory 10 executes the upper page reading of the cell unit CU based on the received command CMD and address information ADD. Then, the read upper page data is transmitted to the memory controller 20 and the ECC circuit 25 executes error correction on the upper page data.

When the error correction on the read upper page data is possible (YES in S30), the CPU 22 registers the page as a good page (step S31). Conversely, when the error correction of the read upper page data fails (NO in step S30), the CPU 22 registers the page as a bad page (step S32).

Subsequently, the memory system 1 executes the top page reading (step S33). Specifically, the memory controller 20 transmits the command CMD instructing a read operation and the address information ADD for designating a top page in the cell unit CU on which the write operation was executed in step S20, to the semiconductor memory 10. Then, the semiconductor memory 10 executes the top page reading of the cell unit CU based on the received command CMD and address information ADD. Then, the read top page data is transmitted to the memory controller 20 and the ECC circuit 25 executes error correction on the top page data.

When the error correction on the read top page data is possible (YES in S34), the CPU 22 registers the page as a good page (step S35). Conversely, when the error correction of the read top page data fails (NO in step S34), the CPU 22 registers the page as a bad page (step S36).

When the memory system 1 completes the process of step S35 or S36, the memory system 1 ends the first operation, and then the processing proceeds to an operation of step S12 illustrated in FIG. 9. In step S12, the CPU 22 confirms whether a bad page was detected in the first operation of step S11.

When the bad page was detected (YES in step S12), the CPU 22 sets the write data retained in the buffer memory 24 that is corresponding to a page which failed error correction in step S11 ("first operation") as write data for writing to a subsequent cell unit CU (step S13). At this time, the CPU 22 discards the data in the buffer memory 24 corresponding to the pages for which the error correction was possible.

Conversely, when no bad page is detected (NO in step S12), the CPU 22 sets write data of a subsequent four pages retained in the buffer memory 24 to write data corresponding to the subsequent cell unit CU.

The CPU 22 confirms whether the writing of all the write data received from the host device 30 has been completed through the operations of steps S11 to S13 described above (referred to as loop LP2).

When the writing of all the write data received from the host device 30 has not yet been completed in the loop LP2, the process returns to the loop LP1 and the memory system 1 executes the first operation of step S11 again.

Conversely, once the writing of all the write data received from the host device 30 is completed in the loop LP2, the memory system 1 ends the write operation.

The above-described operation corresponds to an operation when all the cell information of the writing target cell unit CU is registered in a default state (for example, the QLC) in the cell information retention unit 26. When the writing target cell unit CU includes a page registered as the bad page, the memory controller 20 may execute the write operation of the QLC scheme in a state in which invalid data is inserted into a page corresponding to the bad page. The memory controller 20 may then omit the determination reading on the page which was ascertained as a bad page in the first operation.

1-3 Advantages

In the memory system 1 according to the above-described first embodiment, it is possible to improve a yield rate of the semiconductor memory 10. Hereinafter, detailed advantages of the memory system 1 according to the first embodiment will be described.

Since a semiconductor memory in which the memory cells are stacked 3-dimensionally has high integration of the memory cells, a storage capacity of the blocks BLK increases. In a memory system including such a semiconductor memory, when a block BLK in which a failure occurs is set as a bad block, there is a decrease in the storage capacity of the semiconductor memory. For example, in an inspection process before shipment of the memory system, the storage capacity may be less than a required storage capacity for the product due to the presence of several bad blocks, and thus there is a possibility of the manufacturing yield rate of the memory system will be reduced.

However, the memory system 1 according to the first embodiment manages data in cell units CU. Specifically, the memory system 1 according to the first embodiment executes the write operation of the QLC scheme to write 4-page data on each cell unit CU. Thereafter, the memory system 1 executes a read operation in units of pages on the written 4-page data in the cell unit CU to determine whether the error correction can be executed on a per page basis. Then, a determination of good/bad page for each of the pages in the cell unit is retained in the cell information retention unit 26 in the memory controller 20.

In this way, the memory system 1 according to the first embodiment retains the cell information indicating the storage capacity as useable cell units CU. The memory system 1 according to the first embodiment can use the cell information to store the data in conformity with the ability of each cell unit CU without setting the entire block BLK in which a failure occurs as a bad block.

Thus, the memory system 1 according to the first embodiment can prevent an unnecessary reduction in the storage capacity of entire blocks when only certain cell units CU within the block BLK are those in which a failure occurs. Accordingly, the memory system 1 according to the first embodiment can improve the yield rate and reduce manufacturing cost associated with semiconductor memory fabrication.

The memory controller 20 in the memory system 1 according to the first embodiment can confirm the capacity of a block BLK by reference to the cell information in the cell information retention unit 26 when garbage collection is executed on the block BLK in which a failure occurs.

Thus, since the memory system 1 according to the first embodiment can accurately estimates a capacity necessary to execute garbage collection, it is possible to improve use efficiency of the block BLK.

2. Second Embodiment

A memory system 1 according to a second embodiment has the same configuration as the memory system 1 according to the first embodiment except that a triple-level cell (TLC) scheme is applied as a write scheme. In such a case, the memory system 1 according to the second embodiment executes a first operation in which the TLC scheme is applied in the write operations. Hereinafter, differences between the memory system 1 according to the second embodiment and the memory system according to the first embodiment will be described.

2-1 Allocation of Data

Figure 11:
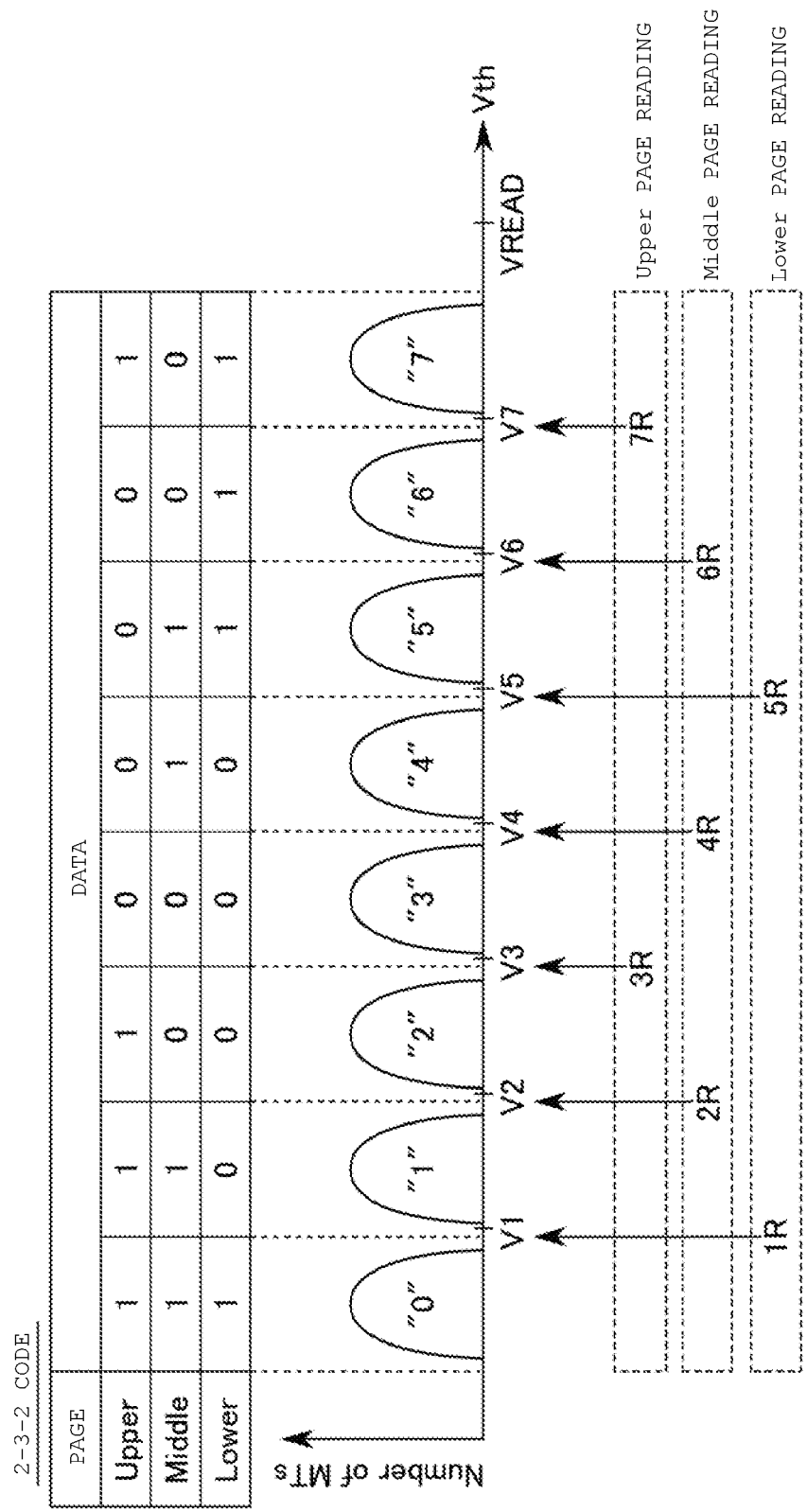
FIG. 11 is a diagram illustrating an example of allocation of data to memory cell transistors according to a second embodiment.

FIG. 11 illustrates examples of a threshold distribution of the memory cell transistors MT, allocation of data, a read voltage, and a verify voltage when a triple-level cell (TLC) scheme is applied.

In the threshold distribution of the memory cell transistors MT illustrated in FIG. 11, the vertical axis corresponds to the number of memory cell transistors MT and the horizontal axis corresponds to a threshold voltage Vth of the memory cell transistors MT. When the TLC scheme is applied, 3-bit data is stored in each memory cell transistor MT and the threshold distribution of the memory cell transistors MT is classified into eight threshold distributions, as illustrated in FIG. 11.

The eight threshold distributions in the TLC scheme are referred to as a "0" level, a "1" level, a "2" level, a "3" level, a "4" level, a "5" level, a "6" level, and a "7" level in order from a lower threshold voltage. For example, the following 3-bit data can be allocated to the threshold distribution.

The following 3-bit data can be allocated:
the "0" level: "111 (lower bit/middle bit/upper bit)" data;
the "1" level: "011" data;
the "2" level: "001" data;
the "3" level: "000" data;
the "4" level: "010" data;
the "5" level: "110" data;
the "6" level: "100" data; and
the "7" level: "101" data.

In the above-described threshold distributions, each read voltage is between adjacent threshold distributions. For example, a read voltage 1R is between a maximum threshold voltage at the "0" level and a minimum threshold voltage at the "1" level. A read voltage 2R is between a maximum threshold voltage at the "1" level and a minimum threshold voltage at the "2" level. Read voltages 3R, 4R, 5R, 6R, and 7R are also between adjacent threshold distributions, in a manner similar to read voltages 1R and 2R. A read pass voltage VREAD is a voltage higher than the maximum threshold voltage in the threshold distribution of the highest level (here the "7" level).

Voltages V1, V2, V3, V4, V5, V6, and V7 illustrated in FIG. 11 are respectively verify voltages used for programs of the "0" level, the "1" level, the "2" level, the "3" level, the "4" level, the "5" level, the "6" level, the "7" level. The verify voltage V1 is between the maximum threshold value at the "0" level and the minimum threshold voltage at the "1" level and is located near a lower base of the threshold distribution of the "1" level. The verify voltages V2, V3, V4, V5, V6, and V7 are selected similarly.

In this scheme, lower page data formed by lower bits is determined according to a read result obtained using the read voltages 1R and 5R. In addition, middle page data is determined according to a read result obtained using the read voltages 2R, 4R, and 6R. In addition, upper page data is determined according to a read result obtained using the read voltages 3R and 7R.

In this way, the allocation of the data illustrated in FIG. 11 is referred to as a "2-3-2 code" since the lower page data, the middle page data, and the upper page data are determined through reading executed two times, three times, and two times, respectively.

2-2 Operation

In a write operation of the memory system 1 according to the second embodiment, the TLC scheme is applied as the write scheme. The memory system 1 according to the second embodiment uses the "2-3-2 code" illustrated in FIG. 11 for allocation of data values.

Figure 12:
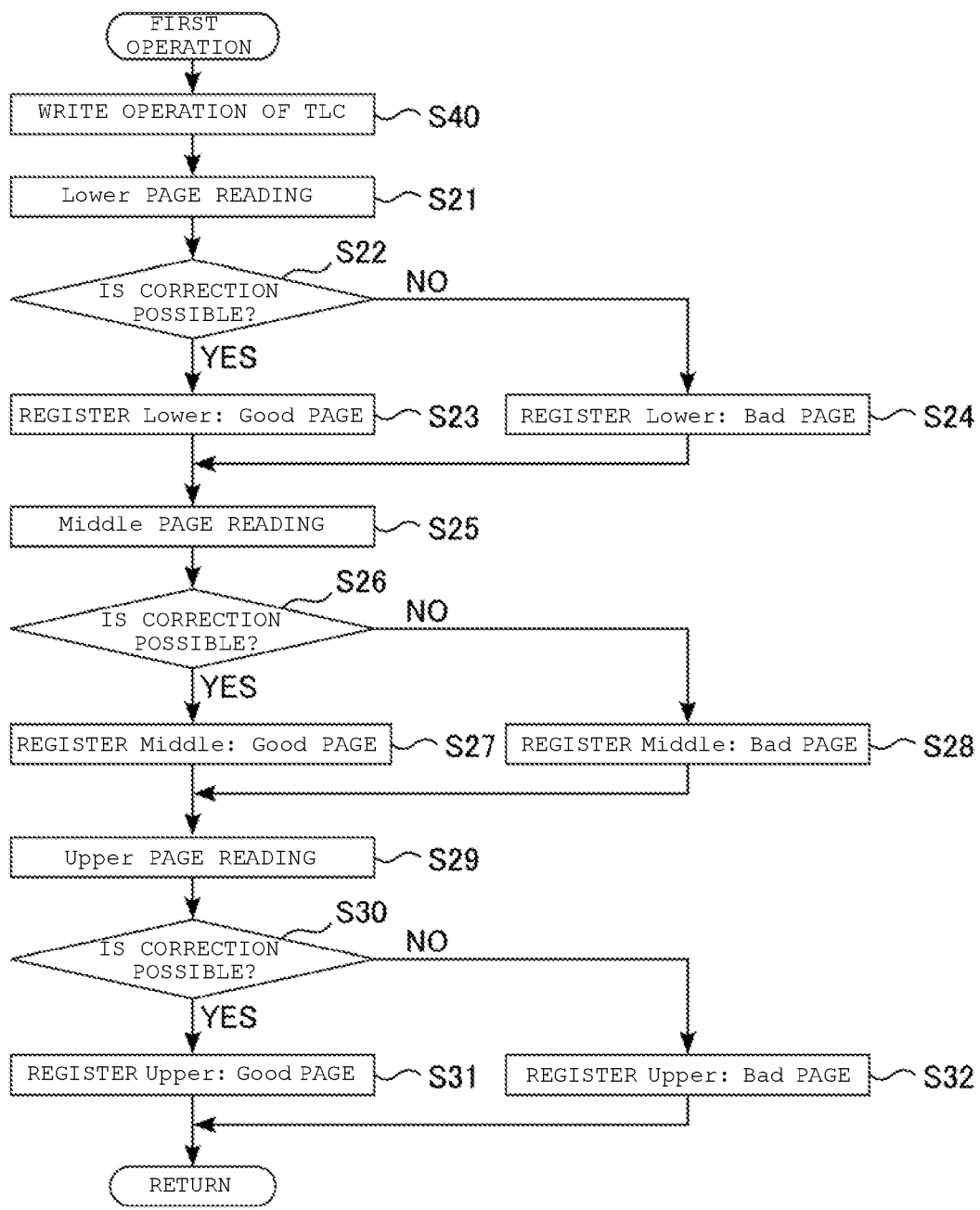
FIG. 12 is a flowchart of a first operation of a memory system according to a second embodiment.

A write operation by the memory system 1 according to the second embodiment is different from the write operation by the memory system 1 according to the first embodiment in details of the first operation. FIG. 12 illustrates an example of a flowchart of the first operation in the memory system 1 according to the second embodiment.

As illustrated in FIG. 12, the memory system 1 first executes the write operation of the TLC scheme (step S40). Specifically, the memory controller 20 transmits the command CMD instructing a write operation, the address information ADD for designating the cell unit CU selected to store data, and of three pages of write data DAT to the semiconductor memory 10. Then, the semiconductor memory 10 executes the write operation for the 3-page data using the 2-3-2 code on the corresponding cell unit CU based on the received command CMD, address information ADD, and write data DAT. In other words, the semiconductor memory 10 executes a write operation of the 3-page data for which one word line WL and one string unit SU have been selected.

Subsequently, the memory system 1 executes the lower page reading of step S21. When the error correction on the read lower page data is possible (YES in step S22), the CPU 22 executes the process of step S23 and registers the page as a good page. Conversely, when the error correction on the read lower page data fails (NO in step S22), the CPU 22 executes the process of step S24 and registers the page as a bad page.

Subsequently, the memory system 1 executes the middle page reading of step S25. When the error correction on the read middle page data is possible (YES in step S26), the CPU 22 executes the process of step S27 and registers the page as a good page. Conversely, when the error correction on the read middle page data fails (NO in step S26), the CPU 22 executes the process of step S28 and registers the page as a bad page.

Subsequently, the memory system 1 executes the upper page reading of step S29. When the error correction on the read upper page data is possible (YES in step S30), the CPU 22 executes the process of step S31 and registers the page as a good page. Conversely, when the error correction on the read upper page data fails (NO in step S30), the CPU 22 executes the process of step S32 and registers the page as a bad page.

When the memory system 1 completes the process of step S31 or S32, the memory system 1 ends the first operation, and then the process proceeds to an operation of step S12 illustrated in FIG. 9. Since the other remaining operations in the write operation by the memory system 1 according to the second embodiment are the same as those of the write operation by the memory system 1 according to the first embodiment, the description thereof will be omitted.

2-3 Advantages

In the memory system 1 according to the above-described second embodiment, it is possible to prevent a reduction in the storage capacity in which a failure occurs, like with the memory system 1 according to the first embodiment. That is, even when the TLC scheme is applied, it is possible to improve the yield rate and reduce manufacturing cost.

In this way, aspects of the first operation described in conjunction with the first embodiment can be applied even when data other than 4-bit data is to be stored in each memory cell transistor MT. For example, the first operation can be applied even when data of one bit, two bits, or five or more bits is stored by the memory cell transistor MT.

3. Third Embodiment

In a memory system 1 according to a third embodiment, the QLC scheme is again applied as a write scheme but a different allocation of data from the first embodiment is applied. The memory system 1 according to the third embodiment has the same structural configuration as the memory system 1 according to the first embodiment except with respect to coding scheme for allocation of data. Then, the memory system 1 according to the third embodiment executes a second operation different from the first operation in a write operation. Hereinafter, differences between the memory system 1 according to the third embodiment and the memory system according to the first embodiment will be described.

3-1 Allocation of Data

Figure 13:
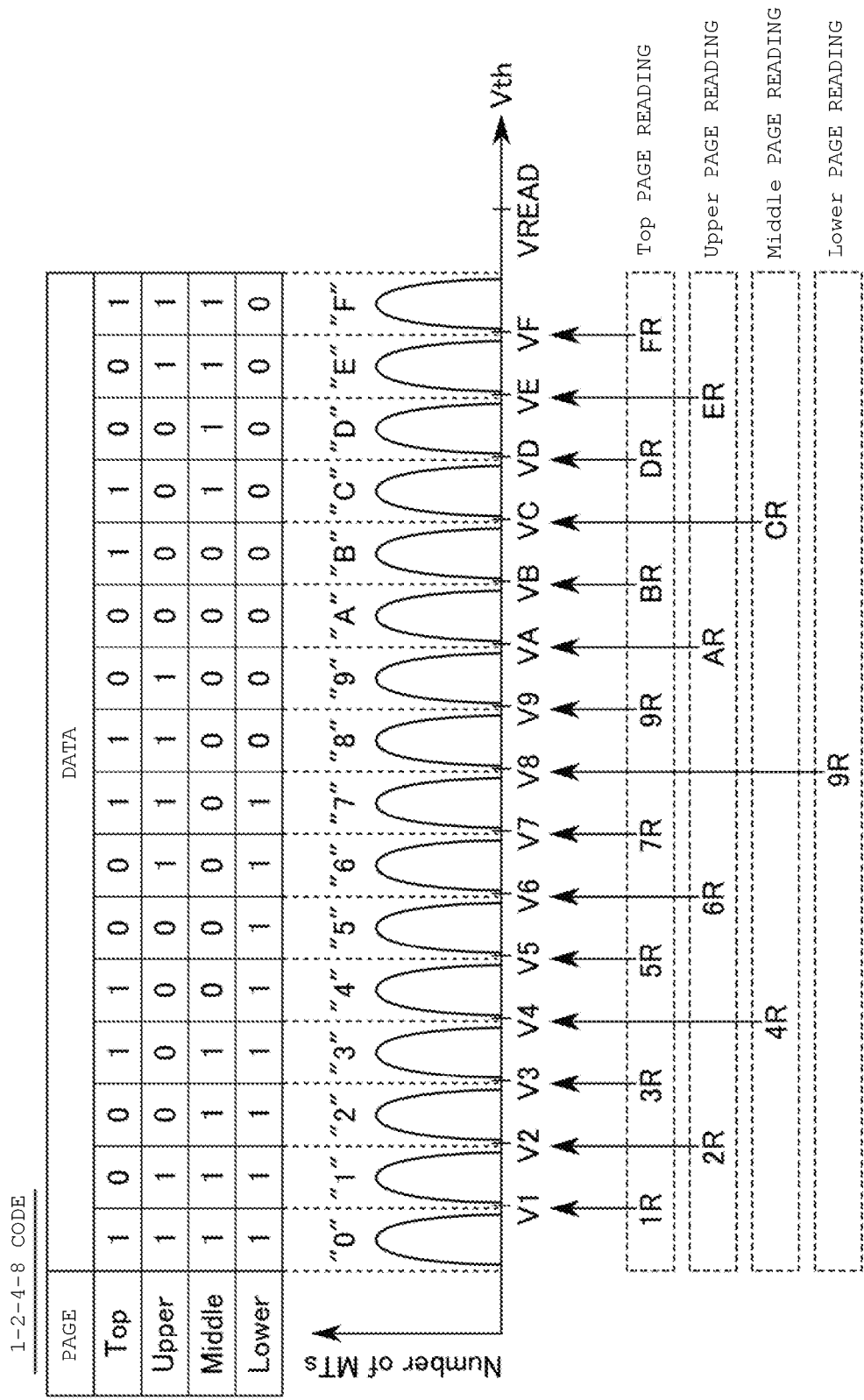
FIG. 13 is a diagram illustrating an example of allocation of data to memory cell transistors according to a third embodiment.

FIG. 13 illustrates examples of a threshold distribution of the memory cell transistors MT, allocation of data, a read voltage, and a verify voltage when a quadruple-level cell (QLC) scheme is applied in accordance with a write scheme for a memory cell. Allocation of data is different from the allocation of data in FIG. 8 described in the first embodiment.

In the allocation of data illustrated in FIG. 13, 4-bit data can be allocated to threshold distributions of a "0" level, a "1" level, a "2" level, a "3" level, a "4" level, a "5" level, a "6" level, a "7" level, an "8" level, a "9" level, an "A" level, a "B" level, a "C" level, a "D" level, an "E" level, and an "F" level.

The following 4-bit data can be allocated:
the "0" level: "1111 (lower bit/middle bit/upper bit/top bit)" data;
 the "1" level: "1110" data;
 the "2" level: "1100" data;
 the "3" level: "1101" data;
 the "4" level: "1001" data;
 the "5" level: "1000" data;
 the "6" level: "1010" data;
 the "7" level: "1011" data;
 the "8" level: "0011" data;
 the "9" level: "0010" data;
 the "A" level: "0000" data;
 the "B" level: "0001" data;
 the "C" level: "0101" data;
 the "D" level: "0100" data;
 the "E" level: "0110" data; and
 the "F" level: "0111" data.

When the above-described allocation of the data is applied, lower page data is determined according to a read result obtained using the read voltage 9R. In addition, middle page data is determined according to a read result obtained using the read voltages 4R and CR. The upper page data is determined according to a read result obtained using the read voltages 2R, 6R, AR, and ER. The top page data is determined according to a read result obtained using the read voltages 1R, 3R, 5R, 7R, 9R, BR, DR, and FR.

In this way, the allocation of the data illustrated in FIG. 13 is referred to as, for example, a "1-2-4-8 code" since the lower page data, the middle page data, the upper page data, and the top page data are determined through reading executed one time, two times, four times, and eight times, respectively.

3-2 Operation

In a write operation of the memory system 1 according to the third embodiment, the QLC scheme is applied as the write scheme. The memory system 1 according to the third embodiment uses the "1-2-4-8 code" illustrated in FIG. 13 for allocation of data values.

The semiconductor memory 10 according to the third embodiment executes a read operation of confirming a page on which data has been written and whether the data written on the page can be correctly read in order from a low-order page after the write operation has been performed on one cell unit CU based on an instruction from the memory controller 20. Hereinafter, this series of operations is referred to as a second operation and the read operation executed in the second operation is referred to as a determination reading. The memory controller 20 determines a state of the cell unit CU based on a result of the determination reading and causes the cell information retention unit 26 to retain the determination result (cell information).

Figure 14:
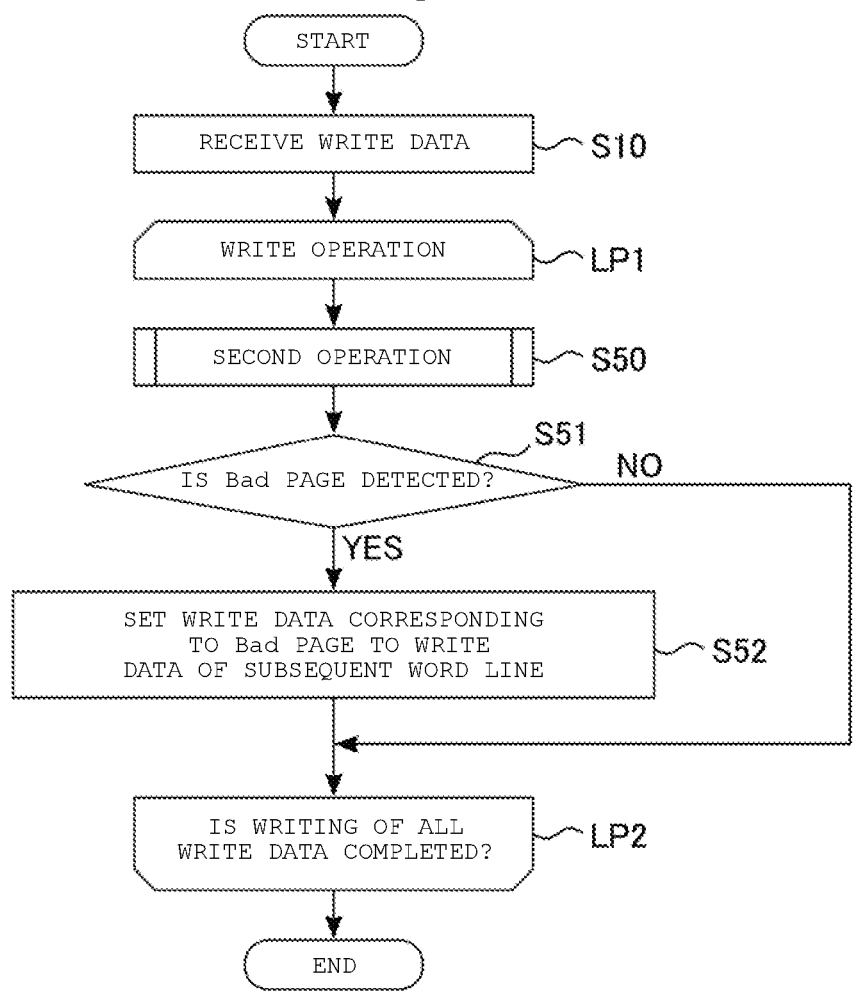
FIG. 14 is a flowchart of a write operation of a memory system according to a third embodiment.

FIG. 14 illustrates an example of a flowchart of the write operation in the memory system 1 according to the third embodiment and is different from FIG. 8 described in conjunction with the first embodiment in the operations in loops LP1 and LP2.

Figure 15:
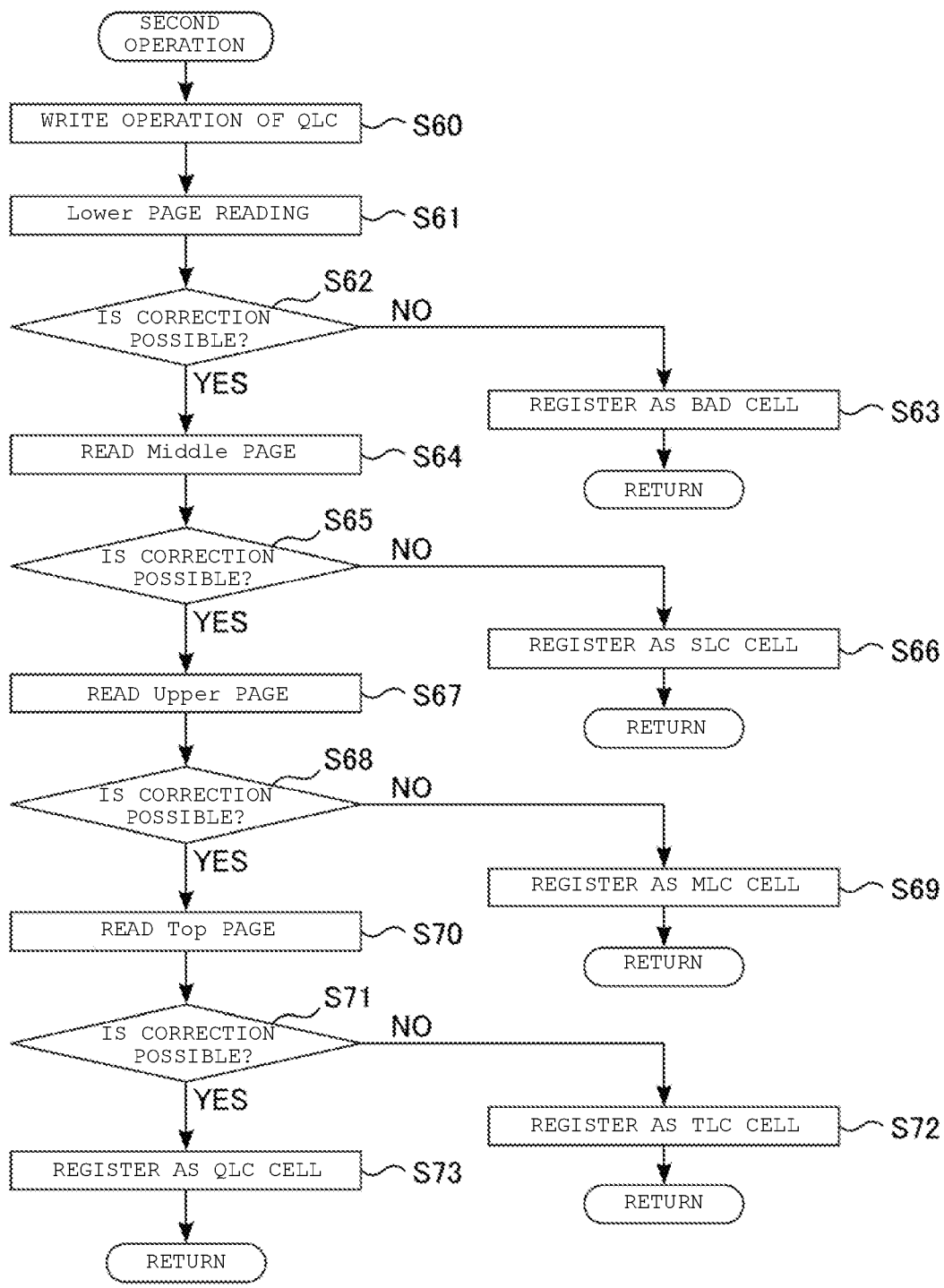
FIG. 15 is a flowchart of a second operation of a memory system according to a third embodiment.

Specifically, in the loop LP1, the memory system 1 executes the second operation (step S50). FIG. 15 illustrates an example of a flowchart of the second operation of the memory system 1 according to the third embodiment.

As illustrated in FIG. 15, the memory system 1 first executes the write operation of the QLC scheme (step S60). Specifically, the memory controller 20 transmits the command CMD to give a write operation, the address information ADD for designating the cell unit CU caused to store data, and the write data DAT of four pages to the semiconductor memory 10. Then, the semiconductor memory 10 executes the write operation of 4-page data to which the 1-2-4-8 code is applied on the corresponding cell unit CU based on the received command CMD, address information ADD, and write data DAT. In other words, the semiconductor memory 10 executes a write operation of the 4-page data for which one word line WL and one string unit SU are selected.

Subsequently, the memory system 1 executes the lower page reading (step S61). The details of the lower page reading are the same as step S21 described in the first embodiment and the read lower page data is transmitted to the memory controller 20 and the ECC circuit 25 executes error correction on the lower page data.

When the error correction on the read lower page data fails (NO in step S62), the CPU 22 determines that the page is a bad cell and causes the cell information retention unit 26 to retain the determination result in association with the address of the cell unit CU (step S53).

Conversely, when the error correction on the read lower page data is possible (YES in step S62), the memory system 1 next executes the middle page reading (step S64). The details of the middle page reading are the same as step S25 described in the first embodiment and the read middle page data is transmitted to the memory controller 20 and the ECC circuit 25 executes error correction on the middle page data.

When the error correction on the read middle page data fails (NO in step S65), the CPU 22 determines that the cell unit CU is an SLC (single level cell) and causes the cell information retention unit 26 to retain this determination result in association with the address of the cell unit CU (step S66).

Conversely, when the error correction on the read middle page data is possible (YES in step S65), the memory system 1 next executes the upper page reading (step S67). The details of the upper page reading are the same as step S29 described in the first embodiment and the read upper page data is transmitted to the memory controller 20 and the ECC circuit 25 executes error correction on the upper page data.

When the error correction on the read upper page data fails (NO in step S68), the CPU 22 determines that the cell unit CU is an MLC (multi-level cell, 2-bit) and causes the cell information retention unit 26 to retain this determination result in association with the address of the cell unit CU (step S69).

Conversely, when the error correction on the read upper page data is possible (YES in step S68), the memory system 1 executes the top page reading (step S70). The details of the top page reading are the same as step S35 described in the first embodiment and the read top page data is transmitted to the memory controller 20 and the ECC circuit 25 executes error correction on the top page data.

When the error correction on the read top page data fails (NO in step S71), the CPU 22 determines that the cell unit CU is a TLC (triple-level cell) and causes the cell information retention unit 26 to retain this determination result in association with the address of the cell unit CU (step S72).

Conversely, when the error correction on the read top page data is possible (YES in step S71), the CPU 22 determines that the cell unit CU is a QLC and causes the cell information retention unit 26 to retain the determination result in association with the address of the cell unit CU (step S73).

Hereinafter, the retention of the result determined as the bad page by the CPU 22 in the cell information retention unit 26 in association with the address of the cell unit CU is referred to as registration of the page as a bad cell. The retention of the result determined as the SLC by the CPU 22 in the cell information retention unit 26 in association with the address of the cell unit CU is referred to as registration of the page as SLC. The retention of the result determined as the MLC by the CPU 22 in the cell information retention unit 26 in association with the address of the cell unit CU is referred to as registration of the page as MLC. The retention of the result determined as TLC by the CPU 22 in the cell information retention unit 26 in association with the address of the cell unit CU is referred to as registration of the page as the TLC. The retention of the result determined as the QLC by the CPU 22 in the cell information retention unit 26 in association with the address of the cell unit CU is referred to as registration of the page as the QLC.

When the process of step S63, S66, S69, S72, or S73 is completed, the memory system 1 ends the second operation, and then the process proceeds to the operation of step S51 illustrated in FIG. 14. In step S51, the CPU 22 confirms the cell information registered through the second operation of step S50.

When a cell unit CU is registered as any one of the bad cell, the SLC, the MLC, and the TLC (YES in step S51), the CPU 22 sets the write data corresponding to a bad page in step S50 as write data for a subsequent cell unit CU (step S52).

In the third embodiment, the write data corresponding to the bad page corresponds to 4-page data including the lower, middle, upper, and top bits when the cell unit CU is registered as the bad cell, corresponds to 3-page data including the middle, upper, and top bits when the cell unit CU is registered as the SLC, corresponds to 2-page data including the upper and top bits when the cell unit CU is registered as the MLC, and corresponds to 1-page data including the top bit when the cell unit CU is registered as the TLC.

Conversely, when a bad page is not detected (NO in step S51), the CPU 22 sets write data of subsequent four pages retained in the buffer memory 24 to write data corresponding to the subsequent cell unit CU.

Subsequently, the CPU 22 confirms whether the writing of all the write data received from the host device 30 is completed through the operations of steps S50 to S52 described above (loop LP2).

When the writing of all the write data received from the host device 30 is not yet completed in the loop LP2, the process returns to the loop LP1 and the memory system 1 executes the second operation of step S50 again.

Conversely, when the writing of all the write data received from the host device 30 is completed in the loop LP2, the memory system 1 ends the write operation.

The above-described operation corresponds to an operation when all the cell information of the writing target cell unit CU is registered to a default state (for example, the QLC) in the cell information retention unit 26. When the writing target cell unit CU corresponds to the bad cell, the memory controller 20 may execute a second operation in which the cell unit CU is skipped and a subsequent cell unit CU is selected.

When the writing target cell unit CU corresponds to a SLC, MLC, or TLC cell unit, the memory controller 20 may still execute a write operation of a QLC scheme by adding invalid data into the write data for the 1-page data, the 2-page data, and 3-page data, respectively, as necessary. Or when the writing target cell unit CU corresponds to the SLC, the MLC, and the TLC, the memory controller 20 may execute the write operation by applying a SLC scheme, a MLC scheme, or a TLC scheme, respectively. Since the other remaining operations in the write operation by the memory system 1 according to the third embodiment are the same as those of the write operation by the memory system 1 according to the first embodiment, the description thereof will be omitted.

3-3 Advantages

In the memory system 1 according to the above-described third embodiment, it is possible to prevent a reduction in the storage capacity in which a failure occurs, like the memory system 1 according to the third embodiment. That is, it is possible to improve the yield rate and reduce manufacturing cost of the memory system 1, like the semiconductor memory 1 according to the first embodiment.

In the memory system 1 according to the third embodiment, the 1-2-4-8 code is applied as the allocation of the data. When the 1-2-4-8 code is applied as the allocation of the data, an error occurrence probability increases in the order of the lower page, the middle page, the upper page, and the top page.

That is, when the 1-2-4-8 code is applied as the allocation of the data, the memory controller 20 can execute the determination reading in order from lower-order pages and consider that error correction on high-order pages of a page is not possible at the time point at which the page in which the error correction is not possible is detected.

Thus, the memory system 1 according to the third embodiment can shorten a time necessary to determine an ability of the cell units CU to store more data than in the first embodiment. Accordingly, the memory system 1 according to the third embodiment can shorten a time necessary for an inspection process, and thus it is possible to reduce the manufacturing cost of the memory system 1.

4. Fourth Embodiment

In the memory system 1 according to a fourth embodiment, the TLC scheme is applied as a write scheme for data and different allocation of data from the second embodiment is applied. The memory system 1 according to the fourth embodiment has the same configuration as the memory system 1 according to the first embodiment except that a TLC scheme is applied as a write scheme for data. The memory system 1 according to the fourth embodiment executes a second operation to which the TLC scheme is applied in a write operation. Hereinafter, differences between the memory system 1 according to the fourth embodiment and the memory system according to the first and second embodiments will be described.

4-1 Allocation of Data

Figure 16:
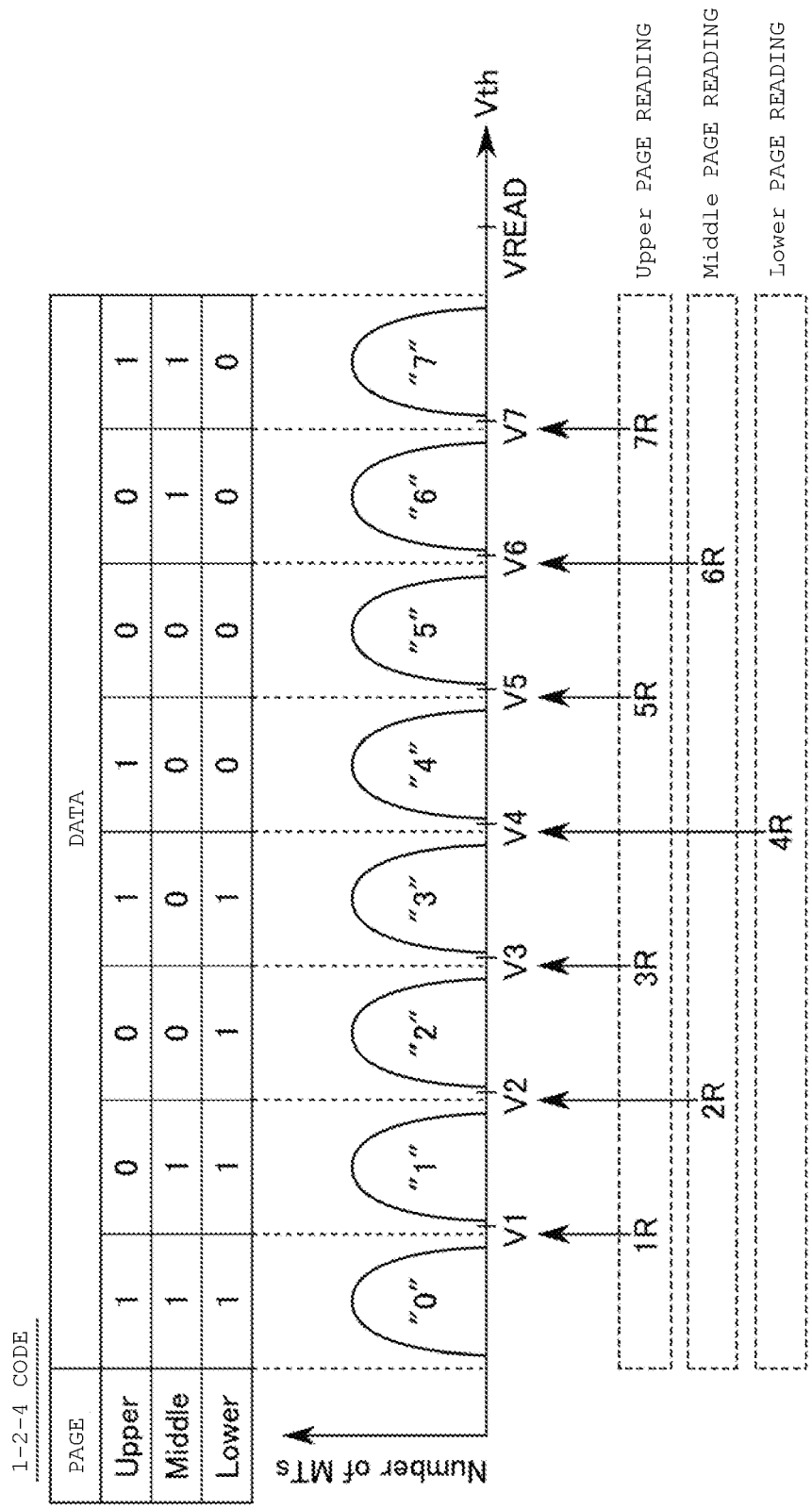
FIG. 16 is a diagram illustrating an example of allocation of data to memory cell transistors according to a fourth embodiment.

FIG. 16 illustrates examples of a threshold distribution of the memory cell transistors MT, allocation of data, a read voltage, and a verify voltage when a triple-level cell (TLC) scheme is applied in accordance with a write scheme for a memory cell. Allocation of data is different from the allocation of data in FIG. 11 described in the second embodiment.

In the allocation of the data illustrated in FIG. 16, the following 3-bit data can be allocated to threshold distributions of a "0" level, a "1" level, a "2" level, a "3" level, a "4" level, a "5" level, a "6" level, and a "7" level.

The following 3-bit data can be allocated:
the "0" level: "111 (lower bit/middle bit/upper bit)" data;
the "1" level: "110" data;
the "2" level: "100" data;
the "3" level: "101" data;
the "4" level: "001" data;
the "5" level: "000" data;
the "6" level: "010" data; and
the "7" level: "011" data.

When this allocation of the data is applied, lower page data is determined according to a read result obtained using the read voltage 4R. In addition, middle page data is determined according to a read result obtained using the read voltages 2R and 6R. The upper page data is determined according to a read result obtained using the read voltages 1R, 3R, 5R, and 7R.

In this way, the allocation of the data illustrated in FIG. 16 is referred to as, for example, a "1-2-4 code" since the lower page data, the middle page data, and the upper page data are determined through reading executed one time, two time, and four times, respectively.

4-2 Operation

In a write operation of the memory system 1 according to the fourth embodiment, the TLC scheme is applied as the write scheme. The memory system 1 according to the fourth embodiment uses, for example, the "1-2-4 code" illustrated in FIG. 16 as allocation of data.

Figure 17:
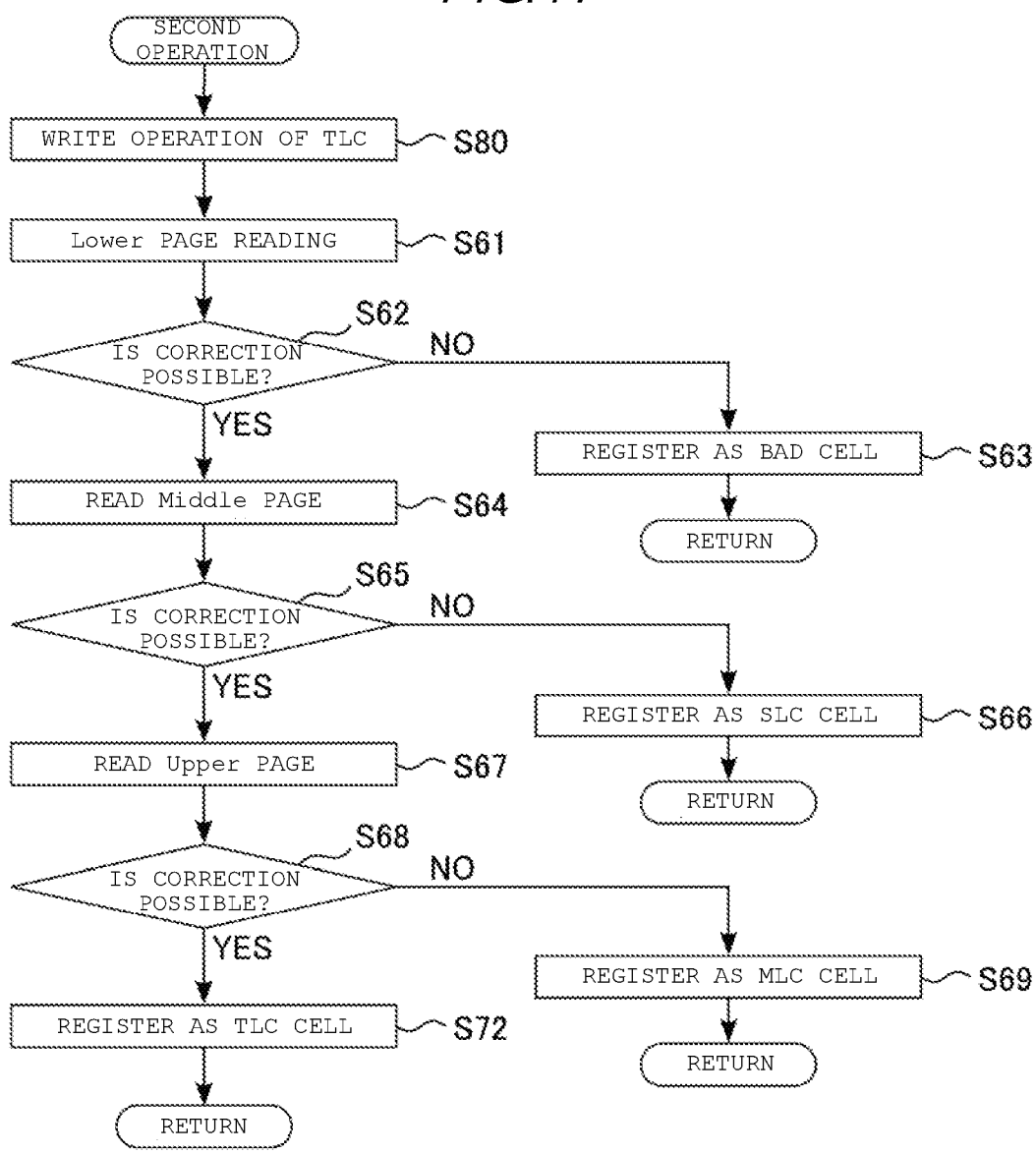
FIG. 17 is a flowchart of a second operation of a memory system according to a fourth embodiment.

The write operation of the memory system 1 according to the fourth embodiment is different from the write operation of the memory system 1 according to the third embodiment in details of the second operation. FIG. 17 illustrates an example of a flowchart of the second operation of the memory system. 1 according to the fourth embodiment.

As illustrated in FIG. 17, the memory system 1 first executes the write operation of the TLC scheme (step S80). Specifically, the memory controller 20 transmits the command CMD to give a write operation, the address information ADD for designating the cell unit CU caused to store data, and the write data DAT of 3 pages to the semiconductor memory 10. Then, the semiconductor memory 10 executes the write operation of 3-page data to which the 1-2-4 code is applied on the corresponding cell unit CU based on the received command CMD, address information ADD, and write data DAT. In other words, the semiconductor memory 10 executes a write operation of the 3-page data for which one word line WL and one string unit SU are selected.

Subsequently, the memory system 1 executes the lower page reading of step S61. When the error correction on the read lower page data fails (NO in step S62), the CPU 22 executes the process of step S63 and registers the cell unit CU as a bad cell. Conversely, when the error correction on the read lower page data is possible (YES in step S62), the memory system 1 executes the middle page reading of step S64.

When the error correction on the read middle page data fails (NO in step S65), the CPU 22 executes the process of step S66 and registers the cell unit CU as an SLC. Conversely, when the error correction on the read middle page data is possible (YES in step S65), the memory system 1 executes the upper page reading of step S67.

When the error correction on the read upper page data fails (NO in step S68), the CPU 22 executes the process of step S69 and registers the cell unit CU as an MLC. Conversely, when the error correction on the read upper page data is possible (YES in step S68), the CPU 22 executes the process of step 72 and registers the cell unit CU as a TLC.

When the process of step S63, S66, S69, or S72 is completed, the memory system 1 ends the second operation, and then the process proceeds to =step S51 illustrated in FIG. 14. Since the other remaining operations in the write operation by the memory system 1 according to the fourth embodiment are the same as those of the write operation by the memory system 1 according to the third embodiment, the description thereof will be omitted.

4-3 Advantages

In the memory system 1 according to the above-described fourth embodiment, it is possible to prevent a reduction in the storage capacity in which a failure occurs, like the memory system 1 according to the third embodiment. That is, it is possible to improve the yield rate, like the semiconductor memory 1 according to the third embodiment even when the TLC scheme is applied as the write scheme for data, and thus reduce manufacturing cost of the memory system 1.

In this way, the second operation described in the third embodiment can be applied even when data other than 4-bit data is stored in each memory cell transistor MT. For example, a second operation as described in conjunction with the third embodiment can be applied even when data of one bit, two bits, or five or more bits is stored by the memory cell transistor MT.

5. Fifth Embodiment

The memory system 1 according to a fifth embodiment has the same configuration as the memory system 1 according to the first embodiment. Then, the memory system 1 according to the fifth embodiment executes a write operation corresponding to the loops LP1 to LP2 described in the first embodiment when a specific condition is satisfied in normal operation. Hereinafter, differences between the memory system 1 according to the fifth embodiment and the memory system 1 according to the first embodiment will be described.

5-1 Operation

The memory system 1 according to the fifth embodiment checks the number of W/E cycles on a writing destination block BLK when an instruction for a write operation and write data are received from the host device 30. Then, the memory system 1 according to the fifth embodiment determines whether, for example, the write operation corresponding to the loops LP1 and LP2 described in the first embodiment will be executed based on the number of W/E times for the block unit.

Figure 18:
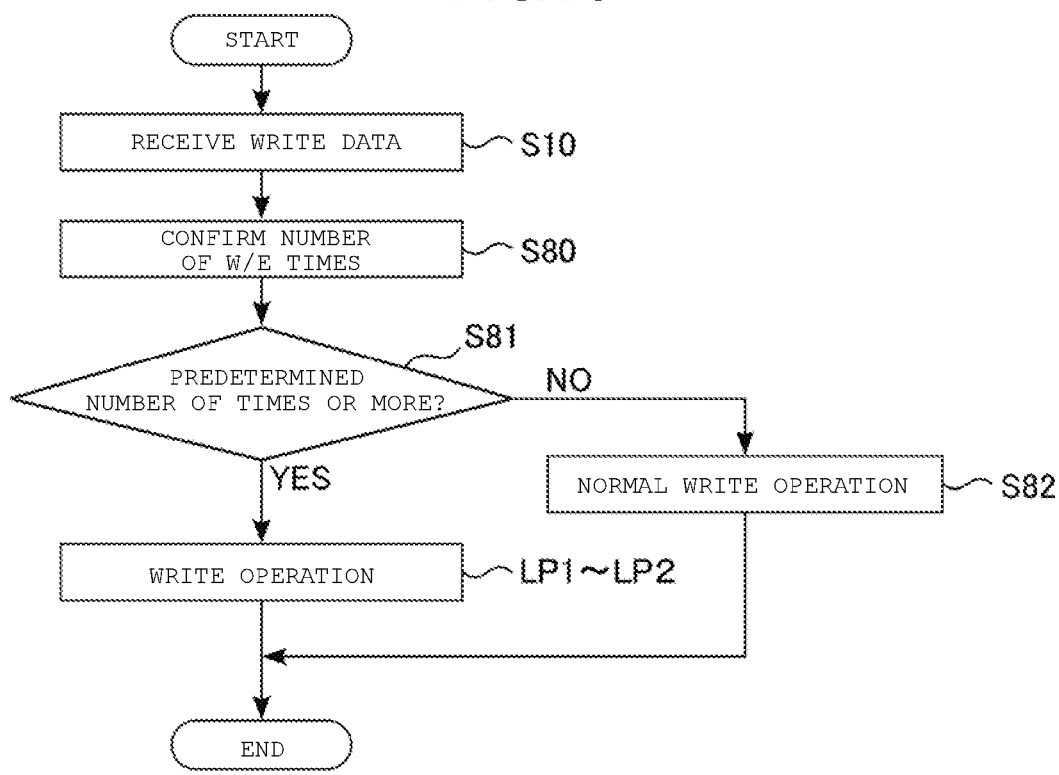
FIG. 18 is a flowchart of a write operation of a memory system according to a fifth embodiment.

FIG. 18 illustrates an example of a flowchart of the write operation of the memory system 1 according to the fifth embodiment. The write operation to be described below is assumed to be performed, for example, in units of blocks BLK.

As illustrated in FIG. 18, the memory controller 20 first receives the instruction for the write operation and the write data via the host device 30 (step S10). Then, the CPU 22 checks the number of W/E times for the writing destination block BLK by reference to, for example, values stored in the RAM 23 (step S80).

When the W/E number for the writing destination block BLK is equal to or greater than a predetermined number of times (YES in step S81), the CPU 22 executes the write operation corresponding to, for example, the loops LP1 and LP2 described in the first embodiment. The write operation executed in the loops LP1 and LP2 can be appropriately changed and the write operation described in the second to fourth embodiments can also be applied.

Conversely, when the W/E number for the writing destination block BLK is less than the predetermined number of times (NO in step S81), the CPU 22 executes, for example, a normal write operation (step S82). Here, the normal write operation corresponds to, for example, the QLC write operation in step S20 described with reference to FIG. 8 in the first embodiment. That is, in the normal write operation, a page by page determination reading is not executed after a threshold voltage of the memory cell transistor MT reaches a desired threshold voltage.

When the write operation for a block BLK is completed in the write operation corresponding to the loops LP1 and LP2 and the normal write operation in step S82, the memory system 1 ends the write operation. When the write data received from the host device 30 exceeds one block BLK in size, the process returns to step S80 and the memory system 1 continuously executes the write operation.

5-2 Advantages

In the memory system 1 according to the above-described fifth embodiment, it is possible to slow a reduction of the storage capacity of the memory system 1 with time of use.

When the W/E number increases, data retention characteristics the memory cell transistors MT tend to deteriorate. When data stored in the cell unit CU in which data retention characteristics have deteriorated to the point at in which error correction by the ECC circuit 25 is no longer effective, a block BLK might be designated a bad block and the data from this block BLK saved in another block BLK.

However, in the memory system 1 according to the fifth embodiment, a reduction in the storage capacity is slowed by disabling only those cell units CU of the block BLK having a page in which errors may not be corrected.

As a result, the memory system 1 according to the fifth embodiment can slow the reduction in the storage capacity of the whole memory system 1 caused with long-time use. Accordingly, in the memory system. 1 according to the fifth embodiment, a life span of the product can be increased.

A threshold of W/E number in step S81 (FIG. 18) can be set to any value. For example, when a user prefers reliability in the memory system 1, the threshold may be set to a relatively small value. When the user prefers high nominal storage capacity in the memory system 1, the threshold may be set to a relatively large value.

6. Sixth Embodiment

A memory system 1 according to the sixth embodiment further includes a thermometer 28 and the other remaining configuration is the same as the configuration of the memory system 1 according to the first embodiment. Then, the memory system 1 according to the sixth embodiment executes the write operation corresponding to the loops LP1 and LP2 described in the first embodiment based on a measurement result of the thermometer 28 in a normal operation. Hereinafter, differences between the memory system 1 according to the sixth embodiment and the memory system according to the first embodiment will be described.

6-1 Configuration of Memory Controller 20

Figure 19:
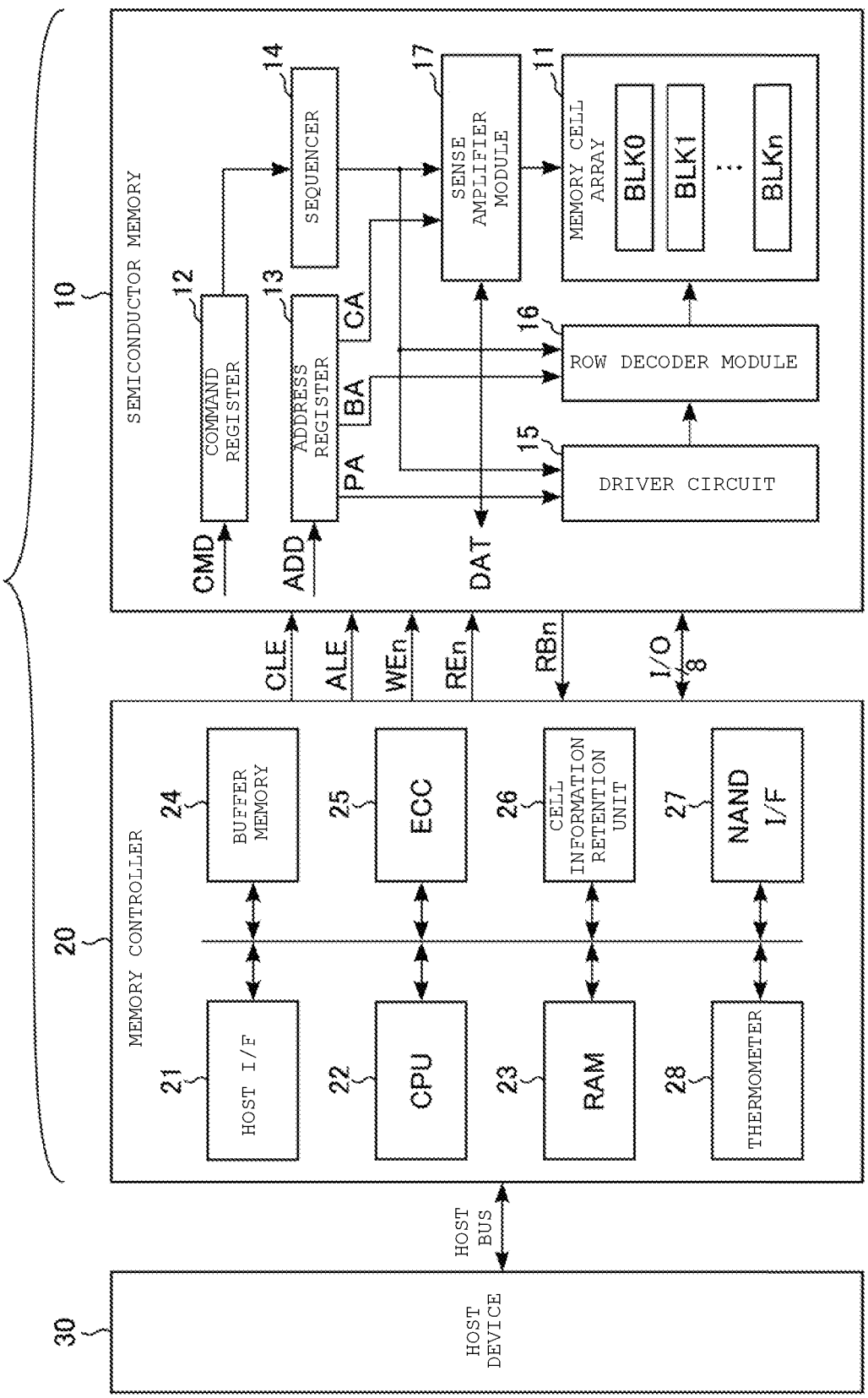
FIG. 19 is a block diagram illustrating a memory system according to a sixth embodiment.

FIG. 19 illustrates a configuration example of the memory system 1 according to a sixth embodiment. The memory controller 20 according to the sixth embodiment further includes a thermometer 28, as illustrated in FIG. 19. The thermometer 28 measures temperature in the memory system 1. A temperature measurement result can be provided to the CPU 22.

In the memory system 1 according to the sixth embodiment, a case in which the memory controller 20 includes the thermometer 28 will be explained, but the specific location at which a thermometer 28 is provided is not limited thereto. For example, the thermometer 28 may be outside of the memory controller 20 or disposed on the outside of the memory controller 20. For example, thermometer 28 can be provided on a chip surface of the memory controller 20, a chip surface of the semiconductor memory 10, a surface of a substrate (circuit board) in the memory system 1, or the like.

6-2 Operation

The memory system 1 according to the sixth embodiment checks the temperature as measured by the thermometer 28 when an instruction for the write operation and write data are received from the host device 30. Then, the memory system 1 according to the sixth embodiment determines whether to execute, for example, a write operation corresponding to the loops LP1 and LP2 described in the first embodiment by reference to the measurement result from the thermometer 28.

Figure 20:
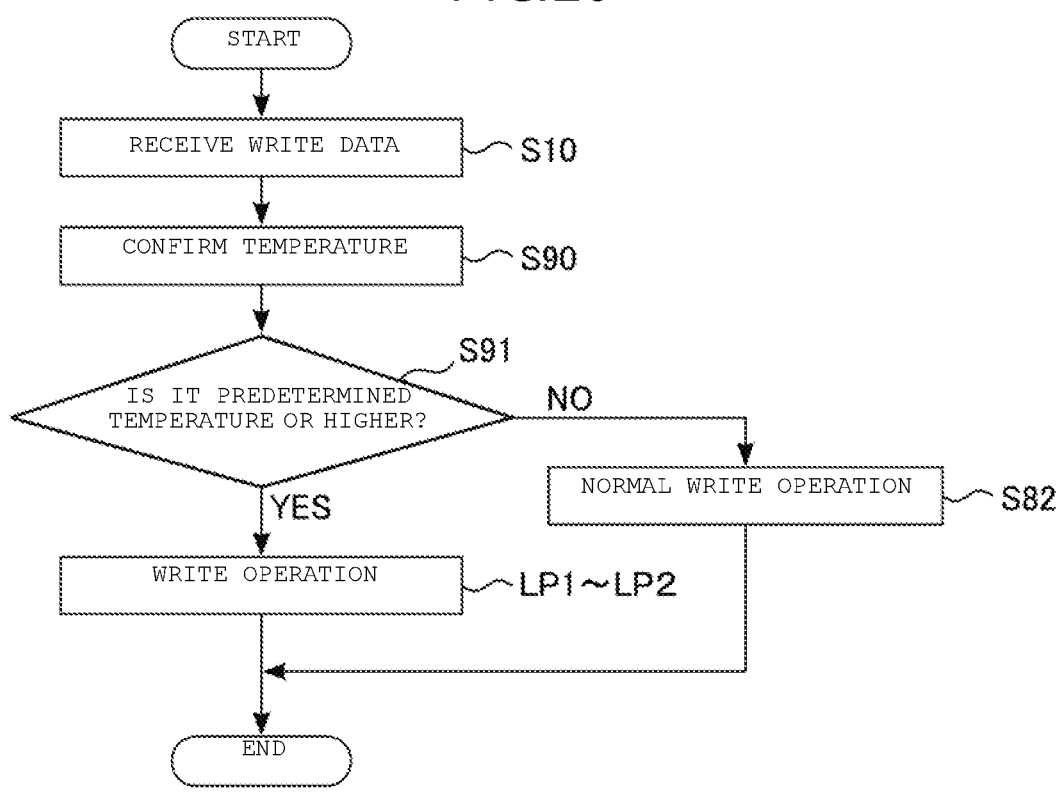
FIG. 20 is a flowchart of a write operation of a memory system according to a sixth embodiment.

FIG. 20 illustrates an example of a flowchart of the write operation of the memory system 1 according to the sixth embodiment. Steps S80 and S81 in FIG. 18 described in conjunction with the fifth embodiment are replaced with steps S90 and S91, respectively.

Specifically, in step S90, the CPU 22 checks the temperature of the memory system 1 by reference to the thermometer 28 or its output.

When the temperature of the memory system 1 is equal to or greater than a predetermined temperature (YES in step S91), the CPU 22 executes the write operation corresponding to the loops LP1 and LP2 described in the first embodiment. The write operation executed in the loops LP1 and LP2 can be appropriately changed and the write operation described in the second to fourth embodiment can also be applied.

Conversely, when the temperature of the memory system 1 is less than a predetermined temperature (NO in step S91), the CPU 22 executes a normal write operation (step S82). Since the other remaining operations in the write operation by the memory system 1 according to the sixth embodiment are the same as those of the write operation by the memory system 1 according to the fifth embodiment, the description thereof will be omitted.

In the memory system 1 according to the sixth embodiment, the checking of the temperature in step S90 may be executed for each block BLK or may also be executed only in the first write operation on the write data that is continuously received from the host device 30. When the confirmation of the temperature is executed only for the first write operation, this setting of the first write operation is applied to subsequent write operations.

The memory controller 20 according to the sixth embodiment may or may not reflect a result of the determination reading in the cell information retention unit 26 when the write operation corresponding to the loops LP1 and LP2 is executed based on a temperature state.

6-3 Advantages

In the memory system 1 according to the above-described sixth embodiment, it is possible to improve reliability of data stored in the memory system 1.

When the temperature of the memory system 1 is high, a variation amount in a threshold voltage caused in a write operation is changed in some cases in the memory cell transistors MT. For example, in data written during a high temperature state of the memory system 1, there is a possibility of the threshold distribution spreading beyond a desired threshold distribution. Thus, there is a possibility of this written data being unreadable.

In the memory system 1 according to the sixth embodiment, however, whether the write operation including a page-by-page determination reading or the normal write operation is executed is based on the temperature state (by reference to the thermometer 28) for the write operation.

As a result, the memory system 1 according to the sixth embodiment can avoid writing data for which error correction will not possible due to a deviation in the threshold distribution caused by the temperature state during the writing operation. Accordingly, since the memory system 1 according to the sixth embodiment can more reliably write data in a state in which error correction will be possible or unnecessary.

7 Modification Examples

The memory system <FIG. 1, 1> according to an embodiment includes the semiconductor memory <FIG. 1, 10> and the memory controller <FIG. 1, 20>. The semiconductor memory includes the plurality of first memory cells <FIG. 2, MT> and the first word lines <FIG. 2, WL> respectively connected to the plurality of first memory cells. The memory controller controls the semiconductor memory. When write data is received from the outside, the memory controller instructs the semiconductor memory to write a plurality of pieces of first page data based on the write data <FIG. 10, S20>. The semiconductor memory writes the plurality of pieces of first page data on the plurality of first memory cells and reads the page data written on the plurality of pieces of first memory cells after the semiconductor memory writes the plurality of pieces of first page data on the plurality of memory cells <FIG. 10, S21>. The memory controller determines whether the page data read from the plurality of first memory cells satisfies a predetermined condition <FIG. 10, S22>, and instructs the semiconductor memory to write the page data corresponding to the page data satisfying the predetermined condition among the plurality of pieces of first page data <FIG. 9, S13>.

In each of the first and second embodiments, the allocation of the data used in the description is merely exemplary. In each of the first and second embodiments, other allocations of data can also be applied. In each of the first and second embodiments, it is possible to obtain the same advantages even when the other allocation of data is applied.

In the first operation described in each of the first and second embodiments, an execution order for the determination reading can be set to any order. That is, in each of the first and second embodiments, the memory controller 20 need not necessarily execute the determination reading in order from a lower-order page.

In the first and second embodiments, the instruction for the write operation received from the host device 30 in step S10 illustrated in FIG. 9 may include an instruction to execute the first operation. Similarly, in the third and fourth embodiments, the instruction for the write operation received from the host device 30 in step S10 illustrated in FIG. 14 may include an instruction to execute the second operation.

In the first operation in the first and second embodiments and the second operation in the third and fourth embodiments, the memory controller 20 can also execute the determination reading irrespective of any command from the host device 30. That is, the memory controller 20 can also instruct the semiconductor memory 10 to execute the write operation corresponding to the first operation and the reading operation after the write operation in response to reception of an instruction for a normal write operation from the host device 30.

In this case, the memory system. 1 executes a write operation including the first operation or the second operation in order when the instruction for the write operation is received. When the instruction for the write operation is received, the memory controller 20 may retain a parameter for determining whether the operations described in the first to fourth embodiments are to be executed in, for example, the RAM 23. This parameter may be changed in accordance with an instruction from the host device 30.

In the foregoing embodiments, examples of the case in which the cell information retained in the cell information storage unit 26 is updated depending on whether error correction is possible or not has been described, but an embodiment is not limited thereto. For example, even when error correction is possible in the determination reading on a certain page, the memory system 1 can perform the same process as is performed in case of failure of the error correction in the foregoing embodiments when the number of error bits in the page exceeds a predetermined number of bits.

In the foregoing embodiments, the memory controller 20 may set a block BLK as a bad block when the storage capacity in the block BLK is less than a predetermined value. Thus, the memory system 1 can prevent frequent occurrence of re-reading in the read operation on the blocks BLK in which deterioration is large, and thus it is possible to prevent a reduction in a reading speed.

In the foregoing embodiments, the example of the case in which the memory controller 20 executes the determination reading immediately after data has been written to a cell unit CU has been described, but an embodiment is not limited thereto. When a storage region in which write data received from the host device 30 can be retained in the memory controller 20 is large, the first operation or the second operation may be executed in units of a plurality of cell units CU or the first operation or the second operation may executed in units of blocks BLK.

In the foregoing embodiments, the example of the case in which the memory controller 20 controls one semiconductor memory 10 has been described, but an embodiment is not limited thereto. FIG. 21 illustrates a configuration example of the memory system 1 according to a modification example of the first embodiment. As illustrated in FIG. 21, the memory system 1 may include four semiconductor memories 10A, 10B, 10C, and 10D. The memory controller 20 may control each of the semiconductor memories 10A, 10B, 10C, and 10D. Furthermore, the number of semiconductor memories 10 in the memory system 1 can be designed to any number and the memory controller 20 may control each of the plurality of semiconductor memories 10. In this case, the memory controller 20 can execute the operation described in the foregoing embodiments on the plurality of connected semiconductor memories 10.

In each of the write operation and the read operation in the foregoing embodiments, voltages to be applied to various wirings are the same voltages as, for example, voltages of the signal lines through which the driver circuit 15 supplies the voltages to the row decoder module 16. That is, the voltages to be applied to various wirings and periods in which the voltages are applied can be substantially known by checking voltages of the corresponding signal lines. When voltages of select gate lines, word lines, and the like are estimated from voltages of the signal lines connected to the driver circuit 15, voltage drop by the transistors TR in the row decoder RD may be considered. In this case, the voltages of the select gate lines and the word lines are lowered by the voltage drop of the transistors TR to be less than the voltages applied to the corresponding signal lines.

In the present specification, "connection" indicates electric connection and intervening conductive elements (e.g., wiring, contacts, via, switches, etc.) between "connected" elements is not excluded. In the present specification, an "OFF state" indicates that a voltage less than a threshold voltage of a transistor is applied to the gate of the corresponding transistor and flow of a relatively minute current such as a leakage current of the transistor is not excluded.

In the foregoing embodiments, (1) in the read operation, a voltage applied to a word line selected in a read operation at the "A" level is in a range between, for example, 0 and 0.55 V. An embodiment is not limited thereto and the voltage may be in a range between 1.0 and 0.24 V, 0.21 and 0.31 V, 0.31 and 0.4 V, 0.4 and 0.5 V, or 0.5 and 0.55 V.

A voltage to be applied to a word line selected in a read operation at the "B" level is in a range between, for example, 1.5 to 2.3 V. An embodiment is not limited thereto and the voltage may be between 1.65 and 1.8 V, 1.8 and 1.95 V, 1.95 and 2.1 V, or 2.1 and 2.3 V.

A voltage to be applied to a word line selected in a read operation at the "C" level is in a range between, for example, 3.0 to 4.0V. An embodiment is not limited thereto and the voltage may be in a range between 3.0 and 3.2 V, 3.2 and 3.4 V, 3.4 and 3.5 V, 3.5 and 3.6 V, or 3.6 and 4.0 V.

A time (tRead) of the read operation may be in a range between, for example, 25 and 38 µs, 38 and 70 µs, or 70 and 80 µs.

(2) The write operation includes the program operation and the verify operation, as described above. A voltage to be first applied to a word line selected in the program operation is in a range between, for example, 13.7 and 14.3 V. An embodiment is not limited thereto and the voltage may be in a range between, for example, 13.7 and 14.0 V or 14.0 and 14.6 V. A voltage to be applied to a word line unselected in the program operation may be in a range between, for example, 6.0 and 7.3 V. An embodiment is not limited thereto and the voltage may be in a range between, for example, 7.3 and 8.4 V or may be 6.0 V or less.

A voltage to be first applied to a selected word line at the time of selecting an odd word line in a write operation may be different from a voltage to be first applied to a selected word line at the time of selecting an even word line. In the write operation, a pass voltage to be applied may be changed depending on whether the unselected word line is an odd word line or an even word line.

When the program operation is set as an incremental step pulse program (ISPP), a step-up width of the program voltage can be set to, for example, about 0.5 V.

A time (tProg) of the write operation may be in a range between, for example, 1700 and 1800 µs, 1800 and 1900 µs, or 1900 and 2000 µs.

(3) In an erasing operation, a voltage to be first applied to a well which is formed in an upper portion of a semiconductor substrate or in which the memory cell is disposed on the upper side is in a range between, for example, 12.0 to 13.6 V. An embodiment is not limited to this case and the voltage may be in a range between, for example, 13.6 and 14.8 V, 14.8 and 19.0 V, 19.0 and 19.8 V, or 19.8 and 21.0 V.

A time (tErase) of the erasing operation may be in a range between, for example, 3000 and 4000 µs, 4000 and 5000 µs, or 4000 and 9000 µs.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A memory system, comprising:
   a semiconductor memory that includes a plurality of first memory cells connected to a first word line; and
   a memory controller configured to control the semiconductor memory to write data into the semiconductor memory in page units equal in size to the number of first memory cells in the plurality of first memory cells, wherein
   the semiconductor memory is configured to write a plurality of pages of data from the write data to the plurality of first memory cells and then read each page in the plurality of pages of data written to the plurality of first memory cells, and
   the memory controller is configured to determine whether each page in the plurality of pages of data as read from the plurality of first memory cells satisfies a predetermined condition, and register a determination result for each page in the plurality pages of data indicating whether the predetermined condition was satisfied.

2. The memory system according to claim 1, wherein
   the semiconductor memory further includes a plurality of second memory cells connected to a second word line, and
   the semiconductor memory is configured to receive page data corresponding to any page of data written to the plurality of first memory cells for which the determination result indicates the predetermined condition was not satisfied from the memory controller and write the received page data to a page of the plurality of second memory cells.

3. The memory system according to claim 2, wherein the semiconductor memory comprises a plurality of stacked conductor layers and a plurality of memory pillars which pass through the plurality of stacked conductor layers and the first and second word lines are formed of adjacent conductor layers in the plurality of stacked conductors.

4. The memory system according to claim 1, wherein the predetermined condition is whether the data read from the page contains an error that is not correctable by an error correction processing.

5. The memory system according to claim 1, wherein 4-bit data is stored in the memory cells of the plurality of first memory cells according to a 4-4-3-4 coding.

6. The memory system according to claim 1, wherein
the memory controller executes the determination on the page data read from the plurality of first memory cells directly after each reading of a page and reads pages from the plurality of first memory cells in an order from a lowest-order bit to a highest-order bit of data written to the plurality of first memory cells, and
when the predetermined condition is not satisfied in the determination for a lower order page, the memory controller instructs the semiconductor memory to read the next higher order page in the plurality of first memory cells and determine whether this next higher order page satisfies the predetermined condition.

7. The memory system according to claim 1, wherein 4-bit data is stored in the memory cells of the plurality of first memory cells according to a 1-2-4-8 coding.

8. The memory system according to claim 1, wherein
the predetermined condition is whether an error correction process on the read page data can be successfully performed or not, and
the memory controller determines that the predetermined condition is not satisfied when the error correction process fails.

9. The memory system according to claim 1, wherein
the memory controller includes a memory unit therein, and
the memory unit is configured to register the determination result in association with an address corresponding to the page data.

10. A memory controller, comprising:
a processor connected to an internal bus;
a local memory connected to the internal bus;
a host interface for connecting to a host device, the host interface connected to the internal bus;
a memory interface for connecting to a non-volatile memory including a plurality of first memory cells connected to a first word line, the plurality of first memory cells comprising a first cell unit for storing multiple pages of data according to a threshold voltage coding, the memory interface connected to the internal bus; and
an error correction code (ECC) circuit connected to the internal bus and configured to encode data for error correction and decode the encoded data, wherein
the processor is configured to:
receive write data from the host device via the host interface,
encode the write data using the ECC circuit;
supply the encoded write data to the non-volatile memory via the memory interface and cause the non-volatile memory to write the encoded write data to at least a lower page and an upper page of the first cell unit;
cause the non-volatile memory to read data from the lower page of the first cell unit and supply the read data from the lower page to the ECC circuit;
attempt error correction on the read data from the lower page with the ECC circuit;
when the error correction on the read data from the lower page is successful, register the lower page as a good page in the local memory, then cause the non-volatile memory to read data from the upper page of the first cell unit and supply the read data from the upper page to the ECC circuit; and
when the error correction is unsuccessful on the read data from the lower page, register the lower page of the first cell unit as a bad page in the local memory unit, then cause the non-volatile memory to read data from the upper page of the first cell unit and supply the read data from the upper page to the ECC circuit; and
set the encoded write data corresponding to a registered bad page for writing to a page of a second cell unit connected to a second word line.

11. The memory controller according to claim 10, wherein the threshold voltage coding is a 4-4-3-4 coding.

12. The memory controller according to claim 10, wherein the threshold voltage coding is a 1-2-4-8 coding.

13. The memory controller according to claim 10, wherein the threshold voltage coding is a 1-2-4 coding.

14. The memory controller according to claim 10, wherein the processor is further configured to:
attempt error correction on the read data from the upper page of the first cell unit with the ECC circuit;
when the error correction on the read data from the upper page is successful, register the upper page as a good page in the local memory; and
when the error correction is unsuccessful on the read data from the upper page, register the upper page of the first cell unit as a bad page in the local memory unit.

15. The memory controller according to claim 10, wherein the memory interface is NAND interface.

16. A non-transitory computer readable storage medium storing firmware that when executed by a processor of a memory controller configures the processor to:
receive write data from a host device via a host interface,
encode the write data using an ECC circuit;
supply the encoded write data to a non-volatile memory via the memory interface and cause the non-volatile memory to write the encoded write data to at least a lower page and an upper page of a first cell unit of the non-volatile memory, the first cell unit comprising a first plurality of memory cells connected to a first word line;
cause the non-volatile memory to read data from the lower page of the first cell unit and supply the read data from the lower page to the ECC circuit;
attempt error correction on the read data from the lower page with the ECC circuit;
when the error correction on the read data from the lower page is successful, register the lower page as a good page in a local memory of the memory controller, then cause the non-volatile memory to read data from the upper page of the first cell unit and supply the read data from the upper page to the ECC circuit; and
when the error correction is unsuccessful on the read data from the lower page, register the lower page of the first cell unit as a bad page in the local memory unit, then cause the non-volatile memory to read data from the upper page of the first cell unit and supply the read data from the upper page to the ECC circuit; and
set a page portion of the encoded write data corresponding to a registered bad page for writing to a page of a second cell unit of the non-volatile memory, the second cell unit comprising a second plurality of memory cells connected to a second word line.

17. The non-transitory computer readable storage medium storing firmware according to claim 16, wherein the threshold voltage coding is a 4-4-3-4 coding.

18. The non-transitory computer readable storage medium storing firmware according to claim 16, wherein the threshold voltage coding is a 1-2-4-8 coding.

19. The non-transitory computer readable storage medium storing firmware according to claim 16, wherein the threshold voltage coding is a 1-2-4 coding.

20. The non-transitory computer readable storage medium storing firmware according to claim 16, wherein the firmware when executed by the processor of the memory controller causes the processor to:
   attempt error correction on the read data from the upper page of the first cell unit with the ECC circuit;
   when the error correction on the read data from the upper page is successful, register the upper page as a good page in the local memory; and
   when the error correction is unsuccessful on the read data from the upper page, register the upper page of the first cell unit as a bad page in the local memory unit.

* * * * *